United States Patent [19]

Yazawa et al.

[11] Patent Number: 5,362,972
[45] Date of Patent: Nov. 8, 1994

[54] SEMICONDUCTOR DEVICE USING WHISKERS

[75] Inventors: Masamitsu Yazawa, Yokohama; Kenji Hiruma, Tokorozawa; Toshio Katsuyama, Ome; Nobutaka Futigami, Mitaka; Hidetoshi Matsumoto, Kodaira; Hiroshi Kakibayashi, Nagareyama; Masanari Koguchi, Higashikurume, all of Japan; Gerard P. Morgan, Galway, Ireland; Kensuke Ogawa, Hachioji, Japan

[73] Assignees: Hitachi, Ltd.; Hitachi VLSI Engineering Corporation, both of Tokyo, Japan

[21] Appl. No.: 686,780

[22] Filed: Apr. 17, 1991

[30] Foreign Application Priority Data

Apr. 20, 1990 [JP] Japan ................................ 2-102948
Apr. 20, 1990 [JP] Japan ................................ 2-102952
Sep. 10, 1990 [JP] Japan ................................ 2-236961
Sep. 21, 1990 [JP] Japan ................................ 2-250262

[51] Int. Cl.$^5$ ............................................. H01L 33/00
[52] U.S. Cl. ................................... 257/13; 257/14; 257/17; 257/20; 257/21; 257/22; 257/24; 257/27; 257/95
[58] Field of Search ..................... 257/13, 14, 15, 16, 257/17, 18, 19, 20, 21, 22, 23, 24, 25, 26, 27, 94, 95, 96, 97, 185

[56] References Cited

U.S. PATENT DOCUMENTS 3,796,598  3/1974  Gejyo ........................ 117/217
3,925,803 12/1975  Kobayashi ................. 357/22
4,155,781  5/1979  Diepers ....................... 148/175
5,054,030 10/1991  Sakaki ......................... 372/46 X

FOREIGN PATENT DOCUMENTS 714152 10/1968 Belgium .

OTHER PUBLICATIONS

Kasahara et al., "GaAs Whiskers Grown by a Thermal Decomposition Method," *Journal of Crystal Growth*, 38 (1977), pp. 23–28.

Yazawa et al., "Heteroepitaxial Ultrafine Wire-Like Growth of InAs on GaAs Substrates," *Appl Phys, Leth* 58(10), 11 Mar. 1991, pp. 1080–1082.

Givargizov, "Oriented Growth of Whiskers of $A^{III}B^V$ Compounds by VLS-Mechanism," *Kristall und Technik*, 10(5), 1975, pp. 473–484.

Givargizov, "Growth of Whiskers by the Vapor-Liquid-Solid Mechanism," *Current Topics in Material Science*, vol. I, Ed. Kaldis, North-Holland, 1978, pp. 79–145.

Butsuri, *Applied Physics*, vol. 59, No. 2, Nov. 29, 1989, pp. 164–169.

Itoh, Junji: "*Vacuum Microelectronics*", Ohyo Butsuri (Applied Physics), vol. 59, No. 2, 10 Feb. 1990, Japan Society of Applied Physics, pp. 164–169.

Sakaki, Hiroyuki, "Scattering Suppression and High-Mobility Effect of Size-Quantized Electrons in Ultrafine Semiconductor Wire Structures", *Japanese Journal of Applied Physics*, vol. 19, No. 12, Dec. 1980 pp. L735–L738.

Eastman, L. F. et al., "Ballistic Electron Motion in GaAs At Room Temperature", *Electronics Letters*, 19th Jun. 1980, vol. 16, No. 13, pp. 524–525.

Research Report No. 425, Applied Electronic Material Property Subcommittee, Sep. 16, 1988, The Japan Society of Applied Physics, pp. 11–16.

(List continued on next page.)

Primary Examiner—William Mintel
Attorney, Agent, or Firm—Kenyon & Kenyon

[57] ABSTRACT

A field effect transistor and a ballistic transistor using semiconductor whiskers each having a desired diameter and formed at s desired location, a semiconductor vacuum microelectronic device using the same as electron emitting materials, a light emitting device using the same as quantum wires and the like are disclosed.

48 Claims, 24 Drawing Sheets

OTHER PUBLICATIONS

Petroff, P. M., Gossard, A. C. Logan, R. A., Wiegmann, W., "Toward quantum well wires: Fabrication and optical properties", Appl. Phys. Lett. 41(7), 1 Oct. 1982, pp. 635–638.

Asai, Hiromitsu et al., "Narrow two-dimensional electron gas channels in GaAs/AlGaAs sidewall interfaces by selective growth", Appl. Phys. Lett 51(19), 9 Nov. 1987, pp. 1518–1520.

Kasahara, J., Kajiwara, K. and Yamada, T., "GaAs Whiskers Grown By A Thermal Decomposition Method", Journal of Crystal Growth 38 (1977), pp. 23–28.

M. Yazawa, et al. "Heteroepitaxial ultrafine wire-like growth of InAs on GaAs substrates", Applied Physics Letters, vol. 58, No. 10, 11 Mar. 1991, pp. 1080–1082.

E. I. Givargizov, "Oriented Growht of Whiskers of $A^{III}B^{V}$ Compounds by VLS-Mechanism", Kristall und Technik, vol. 10, No. 5, 1975, pp. 473–484.

Seigo Ando and Takashi Fukui, "Facet Growth of AlGaAs ON GaAS With $SiO_2$ Gratings By MOCVD and Applications to Quantum Well Wires", Journal of Crystal Growth, vol. 98, No. 4, Dec. 1989, pp. 646–652.

H. Morkoc, R. Stamberg and E. Krikorian, "Whisker Growth during Epitaxy of GaAs by Molecular Beam Epitaxy", Japanese Journal of Applied Physics, vol. 21, No. 4, Apr. 1982, pp. L230–L232.

F I G. 38a
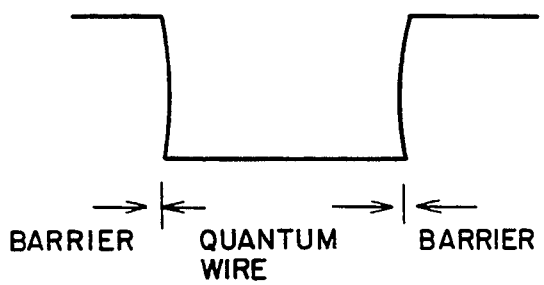
F I G. 38b
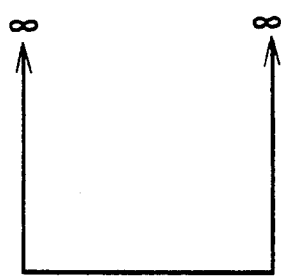
F I G. 39a
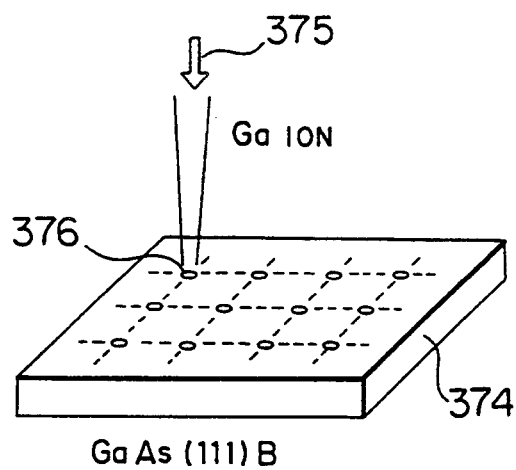
F I G. 39b
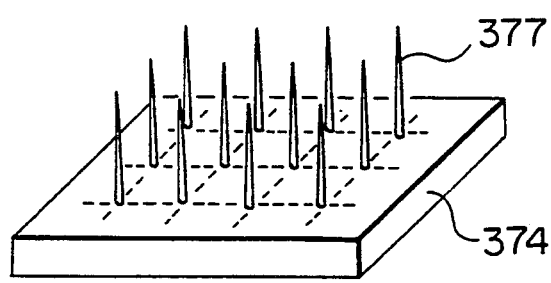

○ As
● Ga

SEMICONDUCTOR DEVICE USING WHISKERS

BACKGROUND OF THE INVENTION

The present invention relates to a semiconductor whisker, a semiconductor device using the same and a manufacturing method thereof, and more particularly to a semiconductor device having channels such as a field effect transistor (FET), a ballistic transistor and the like, a semiconductor device having a needle-pointed electron emitting material such as a semiconductor vacuum microelectronic device and the like, a semiconductor device having a quantum wire such as a light emitting element and the like, and a manufacturing method thereof.

FIG. 47 and FIG. 48 show sectional views of typical field effect transistors (hereinafter referred to as an FET) using a compound semiconductor which has been heretofore used. A case in which GaAs is used principally as a compound semiconductor will be explained hereafter with reference to FIG. 46 and FIG. 47.

In an FET shown in FIG. 46, an n-type GaAs layer 4 is laminated first on a GaAs semi-insulating substrate 7, and an ohmic source electrode 5, a drain electrode 3 and a gate 2 for forming a Schottky junction are formed thereon. A width of a depletion layer 9 is varied by changing a gate bias, thereby to control a three dimensional electron gas (3 DEG) flowing through a channel. Such an FET is called a MESFET in general.

In an FET shown in FIG. 47, a first semiconductor layer 4 composed of an undoped GaAs layer is formed on a GaAs semi-insulating substrate 7, and an n-AlGaAs layer 10 is formed further thereon. Then, highly doped layers S and D are provided while being separated from each other extending from the surface to the semiconductor 4, and a source electrode 5 and a drain electrode 3 are provided through ohmic junction on the surface with these doped layers S and D as a source and a drain. A two dimensional electron gas (2 DEG) produced along an interface between the undoped GaAs layer 4 and the n-AlGaAs layer 10 is used as a channel and controlled by a gate bias. Such an FET is generally called a high Electron Mobility Transistor (HEMT). With the change of the device structure from a MESFET to a HEMT, it has been noticed that electron mobility in the channel is improved remarkably and the operation speed of the FET is also improved. Further, in the HEMT itself, with the improvement of the quality of the crystal, the electron mobility has been increased year by year. However, the value of the electron mobility has also reached the upper limit at present, and transconductance has reached the upper limit already, too, in accordance with the above. There is such a problem that the operation speed of an FET can not be increased any more because the transconductance of a present FET has an upper limit as described above.

While a demand for high speed performance of a device is increasing, an FET having a new structure is necessary in order to break through this limit. As an FET for meeting such a demand, an FET using such a fine wire that electrons conduct themselves as a one-dimensional gas has been proposed as a channel in J.J.A.P., vol. 19, No. 12 (1980) pp. L735–L738. When electrons running with momentum $\hbar k$ through a wire in a wire direction are scattered elastically by means of ionized impurities and the like in a fine wire confined with two dimensions, with the energy preserved low or the energy remained constant the state of electrons after scattering only has $\hbar k$ momentum. Since such elastic scattering is accompanied by large momentum variation, it is foreseen that an elastic scattering rate is very small. Accordingly, it is expected that electrons have very large electron mobility in such a fine wire. Further, if this fine wire is used as a channel, high transconductance may be expected because the electron mobility is high, thus making it possible to realize an FET which is superior in high-speed performance. As described above, several attempts have been made to form a fine wire in which electrons are confined with two dimensions, what is called a quantum wire, but such a technology that a two dimensional gas region formed with a HEMT structure is formed into a wire by nanofabrication is principally adopted. Therefore, damages induced during fabrication cannot be avoided. Thus, an FET having a quantum wire channel of high quality has not yet been obtained.

Incidentally, the electron mobility of GaAs at room temperature is at 8,500 cm/V.s, but the mobility is lowered as a practical matter by means of impurity scattering because impurities are doped when a device is manufactured.

The electron mobility in a channel having a donor impurity concentration at $1\times 10^{18}/cm^3$ is at approximately 2,000 cm/V.s and lowered to 1,000 cm/V.s and below at the base, etc. of a bipolar element having an impurity concentration at $1\times 10^{19}/cm^3$ and higher, and the time required for electrons to pass through an operation layer gets longer by the ratio in which the mobility is lowered, hence the operation speed of the element is reduced. As a means for improving such drawbacks, a ballistic transistor has been proposed in Electronics Letters vol. 16 (1980) pp. 524–525. FIG. 48 shows an example of a device structure thereof. Since the mean free path of electrons in a GaAs crystal is approximately 200 nm in the case of an undoped crystal, electrons can pass through the channel at a high speed without being scattered when a channel length is limited to 400 nm or less. This high speed electronic conduction is referred to as ballistic conduction. When doping of impurities is performed for the purpose of reducing channel resistance, it is necessary to shorten the channel length by the ratio that the mean free path of electrons is reduced in keeping with doping.

A conventional semiconductor vacuum microelectronic device is described in "OHYO BUTSURI" (Applied Physics) vol. 59, No. 2, pp. 164–169, 1990.

FIG. 49 shows in schematic section a structural view of above-mentioned Si vacuum microelectronic device. The construction is composed of an emitter 101 composed of Si formed by utilizing anisotropic wet etching on a (100) plane of a Si substrate 100, an insulator 102 provided around the emitter, a gate 103 and an anode 104, and element operation is performed based on the same principle as a three polar vacuum tube. Here, since electrons emitted from the emitter 101 drift in a vacuum until reaching the anode, some electrons travel faster than the drifting speed of electrons in a semiconductor in principle depending on the distance and the applied voltage between the anode and the emitter. For example, when a potential difference at 50 V is applied between two sheets of platelet electrodes placed in parallel with each other at an interval of 1 μm, electrons travel at a mean velocity of $2\times 10^8$ cm/sec. and the travelling time is 0.5 picosecond. Thus, a super high speed microelectronic device on the order of terrahertz may be realized with a microelectronic device having a dimension on the order of a micron. Such a super high speed microelectronic device cannot be realized in a conventional FET and hetero junction bipolar transistor (HBT) in which electrons drift in a semiconductor material. This is because of such reasons that the drifting speed of electrons in a semiconductor material is determined by a saturated speed and does not exceed a value roughly of $2 \times 10^7$ cm/sec.

A conventional quantum wire is disclosed in "Applied Electronic Material Property Sectional Committee, Research Report No. 425, pp. 11–16 published by The Japan Society of Applied Physics on Sept. 16, 1988".

The above-mentioned quantum wire will be explained with reference to FIG. 50. FIG. 50 is a schematic diagram showing in section a structure of a GaAs quantum wire. As it is seen in FIG. 50, the GaAs quantum wire is formed inside a plurality of crystal layers composed of GaAs layers 322 and 325 and AlGaAs layers 323 and 324.

This quantum wire is formed by making a peripheral portion of a two dimensional electron gas region utilizing hetero junction between GaAs and AlGaAs to have a high resistance by focused ion beam implantation into Si. In FIG. 50, a region having a very small width W equal to approximately 0.1 μm which is not contained in a focused ion beam implanted portion 326 shows a quantum wire among a two dimensional electron gas region shown at 327.

In Appl. Phys. Lett. 51 (1987) pp. 1518–1520, a method of forming a GaAs quantum wire by utilizing selective growth is disclosed. FIG. 51 is a schematic diagram showing a sectional structure of above-mentioned GaAs quantum wire. As shown in FIG. 51, the GaAs quantum wire is formed inside a structure composed of a plurality of layers, GaAs layer 333 and AlGaAs layers 334 and 335.

In the above-described quantum layer, a two dimensional electron gas region 336 is formed by selective growth of GaAs and AlGaAs on a substrate 331. At this time, it is possible to make the height H of the undoped GaAs layer 333 small by making the width D of the selective growth portion approximately 0.1 μm, thereby reducing the region of the two dimensional electron gas 336. Thus, a quantum wire is obtained.

Reduction in line spectrum width of an oscillation light and lowering of threshold current density have been realized in recent years by using a semiconductor quantum well and a quantum wire in an optical device such as a semiconductor laser unit and by multi-dimensional quantum confinement effect of carriers. This fact brings about a preferable result as a light source of high performance in optical communication for instance.

A variety of manufacturing methods have been proposed for such quantum wells and quantum wires. In particular, a semiconductor quantum wire is manufactured by applying nanofabrication technology such as etching and the like to principally a semiconductor such as GaAs (Appl. Phys. Lett. 41 (1982) pp. 635–638).

However, a quantum wire produced by such nanofabrication technology has a drawback that a plurality of damages are formed on a surface or an interface of the fine wire. Such a damage becomes a nonluminescent center in case of a photo emission mechanism and lowers the luminous efficiency substantially. Accordingly, even if a semiconductor laser is produced for instance by utilizing such a quantum wire, highly efficient oscillation can not be generated, thus causing a fatal drawback in practical applications.

SUMMARY OF THE INVENTION

In a conventional FET using a compound semiconductor, remarkable improvement of electron mobility has been noticed as electrons in a channel are made lower in dimensions (three dimensions (FIG. 46)→two dimensions (FIG. 47)), and the value thereof has shown a rising tendency due to an improvement in crystal purity. Of late, however, the value of mobility has been almost saturated and improvement of the value of transconductance which depends on mobility has also reached a limit.

With High-speed being an important characteristic of a device at present, an FET which is capable of higher speed operation is in demanded. Thereupon, it is a first object of the present invention to provide an FET of high speed performance having high transconductance which exceeds the present upper limit value.

Further, in a conventional compound semiconductor device, a lattice mismatch between a substrate and a grown layer causes generation of lattice defects, deterioration of device characteristics attended therewith and so on, thus causing a serious issue at the time of device production. Therefore, a hetero junction system, which is applicable to a device, has been limited only to a portion of a system in which the lattices are matching, for example, a GaAs-AlGaAs system and the like. It is a second object of the present invention to provide a new device structure in which a lattice mismatch system is also applicable.

Furthermore, in a conventional compound semiconductor field effect transistor, it has been difficult to achieve a gate length of 0.1 μm or less because the gate width depends on in-plane processing accuracy. Reduction of the gate length accelerates improvement of operation speed of a transistor. Thus, it is a third object of the present invention to provide an FET having a new structure which makes it possible to obtain a very short gate length at 0.1 μm or less.

Further, in a ballistic transistor, the gate length required for pinchoff of a channel is restricted by an aspect ratio with respect to the channel depth (channel width in FIG. 48). Accordingly, in the case of FIG. 48, it is also required to reduce the channel width to shorten the gate length.

In a conventional ballistic transistor, however, the channel width is restricted by lithography techniques and nanofabrication techniques. Accordingly, it is not possible to sufficiently shorten the channel width (which is obtained by adding the distance between anode and gate and the distance between cathode and gate to the gate length), and it has been required to cool the device with liquid nitrogen so as to make the mean free path of electrons longer in order to evaluate device characteristics. It has been an impediment in practical application of a ballistic transistor that operation at room temperature is difficult because of the limit on miniaturization of device dimensions.

It is a fourth object of the present invention to provide a ballistic transistor which is capable of operation at room temperature and providing high performance.

Furthermore, it is a fifth object of the present invention to provide a semiconductor device having a one dimensional channel of good quality.

An important point in above-mentioned semiconductor vacuum microelectronic device is to increase emission efficiency of electrons at an emitter electrode. For that purpose, it is required to make an angle θ at a tip of the emitter portion as small as possible.

However, since an emitter is formed by wet etching in a conventional microelectronic device, θ is determined almost uniformly and a tip cannot be formed to show a sharp angle at 10° and less. Further, dry etching may be adopted as the etching technique other than the above-mentioned wet etching, but there has been such a problem in this technique that damages remain in the crystal and it is hard to obtain stable electron emission.

It is a sixth object of the present invention to provide a microelectronic device for solving, the above-mentioned problems in a semiconductor vacuum microelectronic device and a manufacturing method of the same.

A quantum wire formed by the above-described conventional technique is surrounded by a medium having a larger dielectric constant than that of air, and cannot be formed in air or in a medium having a dielectric constant equal to that of air. Moreover, a plurality of conductive areas cannot be formed in one quantum wire.

To be concrete, in a quantum wire formed by a conventional technique, a potential difference on electrons between a quantum wire and a barrier therearound has a limited magnitude, which is at 1 eV and below typically. As a result, the electron confinement effect into a fine wire is small, and quantum confinement effect could not be revealed at a high temperature such as room temperature. This fact has caused a drawback that an effective characteristic is not exhibited when such a quantum wire is used as a medium for laser oscillation. In other words, there has been such a problem that decay of important characteristics in application such as increase of spectrum width of oscillation light is caused.

It is a seventh object of the present invention to form a quantum wire structure in air or in a medium having a dielectric constant equal to that of air.

It is an eighth object of the present invention to produce a structure having a plurality of conductive areas in a quantum wire.

It is a ninth object of the present invention to provide an optical device using a quantum wire with conventional drawbacks eliminated.

In order to achieve above-described first through fifth objects of the present invention, a very fine (diameter at 0.1 μm and less) semiconductor whisker which has been grown epitaxially on a semiconductor substrate is used as a channel. The diameter of a whisker of the present invention has a value in the vicinity of the middle point of the whisker. When it is used in a semiconductor device, the diameter of the whisker has a value in the vicinity of the middle point of the whisker in the device.

Here, lattice match is not required between a semiconductor substrate and a material of a whisker. Further, it is possible to generate carriers flowing in a channel in the case of an FET by adopting well-known methods such as providing conductivity with the whisker itself or carrier generating mechanism in a HEMT.

Further, it is possible to produce an FET having a short gate length by using a side of a gate electrode film formed on a semiconductor substrate as a gate.

Next, an FET of the present invention will be described in a more concrete manner. Above-mentioned first through third objects may be achieved by an FET having a structure in which a conductive semiconductor substrate is used as a source (or a drain), a compound semiconductor whisker formed by epitaxial growth on the conductive smeiconductor substrate is used as a channel, and a material selected in relationship with carrier generation, a gate, a material selected in relationship with carrier generation and a drain (or a source) are layered in that order so as to surround the whisker.

Further, the above-mentioned fourth object of the present invention may be achieved by a ballistic transistor having a structure in which an n-type semiconductor layer is used as a cathode, a compound semiconductor layer which becomes a part of a channel is formed on the n-type semiconductor layer, whiskers are formed on this compound semiconductor layer, a Schottky gate, an insulator and an anode are layered in that order so as to suround these whiskers, and the length of a channel consisting of the compound semiconductor layer and the whiskers is made to 400 nm or less. Here, a structure in which whiskers are used in place of the compound semiconductor layer and buried with an insulator so as to surround the circumference thereof may be adopted, too.

The operation of an FET of the present invention will be described taking FIG. 1 as an example. The FET in FIG. 1 shows a case in which carriers are electrons. Electrons reach a drain electrode 3 from a source electrode 5 through a conductive semiconductor substrate (source) 11 and whisker channels 1. A material of a layer shown at 6 is selected in relationship with carrier generation in the channels. In case the whiskers themselves have conductivity, an insulating material is selected, and when the whiskers have no conductivity (undoped), a HEMT mechanism for instance, i.e., an n-type semiconductor having smaller electron affinity than that of the whiskers is selected. In this case, a band diagram at a junction portion between the whisker channels 1 and the n-type semiconductor layer 6 is as shown in FIG. 2, and a one dimensional electron gas (1 DEG) is confined in the whisker channels 1. The gate length L is in accord with the film thickness of a Schottky gate 2. By varying the applied voltage of the Schottky gate 2, the flow of electrons e− in the one dimensional electron gas (1 DEG) confined in the whisker channels 1 is controlled. This fact will be described in detail with reference to FIG. 3, FIG. 4, FIG. 5a and FIG. 5b. FIG. 3 shows a case in which a junction portion between the whisker channel 1 and the Schottky gate electrode 2 has been extracted. By varying the applied voltage of the gate 2, a depletion layer 9 changes as shown in FIG. 4 in the band diagram of the junction portion, and the flow of electrons e− is controlled. In order to show such a state in the concrete, sectional views in a parallel direction and in a vertical direction with respect to the channel at the gate portion in FIG. 3 are shown in FIG. 5a and FIG. 5b, respectively.

Further, any gate construction that is able to control carriers may be employed. An electric current is controlled by means of a gate in a similar manner as above not only in the Schottky junction employed herein (FIG. 6 shows a sectional view of a gate portion taken along a dotted line W in FIG. 1), but also in an MIS structure in which an insulator 13 shown in FIG. 7 is put between the gate 2 and the channel 1.

The present invention is based on discovery of a technique to grow a semiconductor whisker having a diameter of 0.1 μm and less on a semiconductor crystal. This whisker grows in a vertical direction with respect to the substrate surface (including not only the vertical but inclined direction). According to this growth technique, control of a whisker growth position and whisker diameter is made possible. Further, very high electron mobility is expected in the channel because of very high quality of crystal and of a fact that elastic scattering caused by static ionized impurities and the like is suppressed by one dimensional nature of electrons in the channel. Such improvement of electron mobility brings about improvement of transconductance which governs the operation speed of an FET, thus achieving a high-speed FET having large transconductance.

Also, the whisker has a feature that no defect is contained in a crystal even in case it is grown on a semiconductor substrate having large lattice mismatch. Accordingly, even hetero junction having large mismatch which has been heretofore considered to be inappropriate to a device may be applied to an FET according to the present invention.

Furthermore, the film thickness of the gate electrode becomes the gate length and a very short gate length at 0.1 μm and less may be attained by forming the gate 2 so as to surround the channels 1 as shown in FIG. 1, FIG. 3 and FIG. 5a.

A case in which carriers are electrons has been described above, but it is a matter of course that similar effects are also obtainable when holes are used as carriers.

Further, a ballistic transistor is actuated even when the gate length is shortened since the sectional area of the whisker is small. Accordingly, it operates even if the film thickness of a Schottky gate is taken as the gate length. As a result, the channel length may be made short, and furthermore, operation at room temperature becomes feasible since the whisker has a long mean free path of electrons.

A sixth object of the present invention may be achieved by forming an emitter of a semiconductor vacuum microelectronic device with whiskers.

The whisker can be formed by vapor phase growth utilizing thermal decomposition of an organic metal, which will be described with reference to Fig. 2a thru FIG. 22c taking a case of GaAs as an example.

An insulator 91, a metal 92, an insulator 93 and a metal 94 are deposited in this order in a thin film form on a GaAs (111) substrate 90 (FIG. 22a).

A hole 95 is bored through above-mentioned four deposited layers by photolithography (FIG. 22b).

A whisker 95' is grown on the substrate provided with above-mentioned hole 95 by organometallic vapor phase epitaxy (FIG. 22c). According to this technique, it is possible to have only one whisker grow at the bottom portion of the hole, i.e., on the face where the GaAs substrate is exposed when the dimension of the hole 95 is at 1 μm and less as described later with reference to FIG. 32. Moreover, the thickness and the length of the whisker can be controlled by growth time and raw material supply quantity.

The reason why the whisker grows only at the bottom portion of the hole 95 in FIG. 22c is that selective growth of organometallic vapor phase epitaxy is utilized as described later with reference to FIG. 33.

Here, the tip of the whisker has a sharp configuration beyond comparison with a conventional emitter configuration shown in FIG. 49, and is best suited for electron emission with high efficiency.

The seventh object of the present invention may be achieved by means of a quantum wire using a fine crystal in a whisker form. This is based on a new discovery that a fine crystal in a whisker form grows when vapor phase chemical reaction by organometallic thermal decomposition is utilized.

FIG. 32 is a schematic diagram showing quantum wires according to the present invention. An insulating film pattern 302 is formed on a substrate 301, and GaAs which becomes quantum wires 304 are grown selectively at windows 303. At this time, quantum wires were obtained when the dimension of an opening width D of the window provided on the insulating film pattern 302 is set to be approximately 0.1 μm, a ratio D/d of the dimension d of the insulating film pattern 302 to the dimension D of the window is set to 1/100 and below, and the substrate temperature at the time of selective growth is set in a range of 350°-480° C.

The length (height) H of a quantum wire can be controlled by varying the raw material supply quantity and the growth time at the time of selective growth.

According to the above-mentioned quantum wire forming method, selective growth is executed by forming an insulating film pattern on a substrate.

A technique for forming quantum wire crystals without utilizing an insulating film pattern will be explained with reference to FIGS. 39a and 39b and Fig. 40a through FIG. 40c.

First, a technique shown in FIGS. 39a and 39b will be described.

For example, a focusing beam 375 of gallium is radiated at constant intervals onto the substrate surface using GaAs substrate B 374 having plane orientation (111), thereby to form gallium ion implanted portions 376 in a checkers configuration (FIG. 39a).

Here, it is possible to focus the gallium ion beam down to about 10-100 nm on the substrate surface, and the irradiated portion with the ion beam presents a state in which gallium elements are accumulated excessively.

GaAs whiskers 377 are formed from the gallium ion implanted portions 376 by exposing the substrate irradiated with the gallium ions in an arsine (AsH₃) atmosphere (FIG. 39b). Here, the thickness of the whisker 377 is determined by the dimension of the excessively accumulated portion with gallium elements accumulated in gallium ion implanted portion 376. Namely, when the dimension of the gallium ion implanted portion 376 is at approximately 50 nm in diameter, the thickness of the whisker formed here becomes approximately 40-50 nm.

Next, a method shown in FIGS. 40a through 40c will be described, taking a case in which GaAs (111) B is used as a substrate 380 on which whiskers are to be formed as an example.

Linear grooves 382 are formed at constant intervals on the surface of substrate 380 using a scriber 381 (FIG. 40a). When it is assumed that the width and the depth of the groove 382 are at 3 μm and 1 μm, respectively, and the interval between grooves is at 4 μm, and the scriber is made to scan so as to meet at right angles on the substrate, only very small faces can be formed as non-cut faces 383 as shown in FIG. 40b.

It is also possible to make the dimension of each of a plurality of non-cut faces 383 formed on the substrate 380 to be approximately 1×1 μm for instance.

Next, whiskers 384 are formed selectively on the non-cut faces 383 on above-mentioned substrate by organometallic thermal decomposition (FIG. 40c). Here, the reason why the whiskers are formed selectively on the non-cut faces only will be described later.

A whisker growth mechanism will be explained with reference to FIGS. 33a and 33b.

Vapor phase growth of a compound semiconductor is performed by organometallic thermal decomposition on a substrate 341 on which a pattern of an insulating film 343 is formed. This vapor phase growth is performed after degrading regular film growth conditions (conditions under which a film is not formed). Here, a raw material deposited on the insulating film 343 among those raw materials 345 that reach the substrate while in vapor phase moves on the insulating film surface by thermal motion and vapor phase diffusion. During the process of movement, the new raw material is taken in from the vapor phase, thus forming growth species 344. Further, growth species having larger dimensions are formed sometimes by means of nucleation of respective growth species. These growth species reach the opening portion of the insulating film and adhere to the substrate surface, thus forming nuclei 342.

When the raw material is supplied further, crystal faces having faster growth speed stretches preferentially from the growth nuclei 342 and become whiskers 346. The number, thickness and length of whiskers formed at the opening portion of the insulating film pattern 343 can be controlled easily by dimensions of the opening portion and the non-opening portion, the ratio of D to d, substrate temperature, raw material supply quantity, growth time, crystal plane orientation of the substrate and the like.

FIGS. 41a, 41b, 41c and 41d show schematically plane orientations of crystals in which such whiskers are formed. In FIGS. 41a through 41d, orientations of bonding among Ga atoms and As atoms in a GaAs crystal and dangling bond on the surface are shown. Here, (111) A plane means a Ga atomic plane on (111) plane, and (111) B plane means an As atomic plane on (111) plane.

It has been found that whisker growth of GaAs and InAs occurs preferentially on (111) B plane, i.e., an As atom plane, and is difficult to occur on a Ga plane of the GaAs substrate.

Thus, it becomes possible to control a growth orientation of whiskers by selecting the plane orientation of the substrate appropriately.

In FIG. 41a, since the direction of dangling bond of As atoms is perpendicular to the substrate surface, the whiskers grow also perpendicular to the substrate surface.

In FIG. 41b, it is shown that the directions of dangling bond of As atoms, i.e., [111] B have two equivalent directions having inclination at an angle of approximately 35° with respect to (001) plane of the substrate surface. Therefore, whiskers grow in these two equivalent directions.

In FIG. 4c, the direction [111] B of dangling bond of As atoms has, on (110) plane, an inclination at an angle of approxiamtely 55° with respect to the substrate surface (110). Accordingly, whiskers grew in this one direction only on the (110) plane.

FIG. 41d shows schematically sections where variety of planes B appear.

FIG. 41d shows schematically sections where variety of faces B appear.

It will be noticed that, according as the B plane appears at (211)B, (311)B and (511)B starting from (111)B, the number (density) of dangling bond of As atoms per unit plane gets smaller and the direction (angle) thereof varies.

Thus, it is possible to control the forming density of whiskers and the inclination angle of growth axes with respect to the substrate surface. Next, a technique of implantation of gallium ions will be described.

On the gallium ion deposited portion 376 shown in FIG. 39a, a crystal plane similar to nuclei 342 shown in FIG. 33a is formed. When such a substrate is heated to 400° C. and an arsine gas (AsH$_3$) is applied onto the heated substrate, a GaAs nucleus is generated in the gallium ion implanted portion 376 by thermal decomposition of AsH$_3$, which becomes a whisker. It is preferable that ions are low melting point metals. A damaged layer on the substrate surface may be used for nuclei. The damaged layer is obtained by implanting ions so as to disturb a crystal structure of the substrate.

Next, a technique of cutting a substrate mechanically will be described.

In FIG. 40c, the whiskers are formed selectively on the arsenic face only when only a non-cut faces 383 are arsenic faces (face B) and the surface in the groove 382 formed by cutting with a scriber is not an arsenic face.

According to a quantum wire of the present invention, it is possible to form a quantum wire structure in air or a medium having a dielectric constant equal to that of air. Therefore, it is possible to enlarge the potential difference between a barrier and a quantum wire almost infinitely as shown in FIG. 38b. As a result, a confinement effect of electrons into a fine wire is increased, and conspicuous quantum confinement effect is realized even at a high temperature such as room temperature, being different from the past. This fact contributes epochally to improvement of characteristics of a device using such a quantum wire.

Furthermore, it is possible to make the difference in a dielectric constant between a quantum wire and a barrier therearound very large in the quantum wire according to the present invention. Therefore, it is possible to confine electric lines of force generated in the quantum wire in a fine wire very efficiently for instance. This acts to increase non-linear effects participated by electrons remarkably, thus making it possible to realize an efficient non-linear logical device.

It may be achieved to form a plurality of conductive regions in a quantum wire which is the eighth object of the present invention by varying conductivity in an order of n-type and p-type successively in a longitudinal direction of the wire in the concrete. Since quantum wires have been formed in parallel with each other on a semiconductor substrate conventionally, it has been impossible to vary conductivity in a quantum wire. On the contrary, since quantum wires are generated in a direction perpendicular to a substrate, it is possible to vary conductivity in half-way of fine wires by atmospheric control of a raw material gas source.

The ninth object of the present invention may be achieved on the basis of using whiskers which have grown on a semiconductor substrate.

In general, a whisker has such a feature that crystal defects are reduced due to a unique growth mechanism. Accordingly, when these whiskers are used as a light emitting element fox instance, non-emitting processes are decreased, thus making it possible to produce microelectronic devices having a high emission efficiency for a semiconductor laser unit and a high optical modulation efficiency for an optical modulator.

To be concrete, it is possible to grow whiskers on the semiconductor substrate first and implant carriers by applying an electric current thereto thereby to have them emit light. There are a semiconductor laser, a light emitting diode (LED) and the like as a concrete light emitting element.

Here, in order to improve the quantum confinement efficiency and to improve characteristics of the optical microelectronic device such as reduction of the spectrum width and stabilization of the oscillation wavelength in a semiconductor laser, it is required that the diameter of a grown whisker is at 0.1 μm or less. When this value is exceeded, the quantum confinement effect becomes difficult to be revealed.

In order to further improve the emission efficiency of an optical microelectronic device such as above-mentioned semiconductor laser, it is indispensable that electric properties are different in a longitudinal direction of a whisker where an electric current is applied. In particular, it has been made clear that the emission efficiency is improved remarkably when the electric property is changed from an n-type to a p-type or from a p-type to an n-type in the longitudinal direction. An emission spectrum width is narrowed substantially as compared with a conventional device, thus making it possible to obtain laser light of high optical impurity easily.

FIG. 42 shows a mechanism thereof, in which a lower half of a whisker 402 which has grown on an n-type semiconductor substrate 401 is formed into an n-type and an upper half thereof is formed into a p-type by mixing of a dopant. When a voltage is applied to this whisker as shown in the figure, carriers are implanted into the whisker, and light is emitted with high efficiency from a very small p-n junction formed in the whisker crystal. In this case, the n-type and the p-type may be made upside down naturally, and it is required to use a p-type semiconductor as the substrate at that time.

Assuming that the electric property changes in a longitudinal direction in the whisker crystal, the emission efficiency is improved not only when the electric property changes from an n-type to a p-type, but also when it changes from an n-type to an i-type and further to a p-type. It is needless to say that the same holds true when the electric property changes from a p-type to an i-type and further to an n-type.

Furthermore, it is required that a medium around the above-mentioned whisker is different from the material quality of the whisker and the electron affinity thereof is smaller than that of the whisker in order to reveal the quantum confinement effect. Further, when the surrounding medium is formed of an insulator, the quantum confinement effect may be revealed better.

As a concrete substrate for growing a whisker, GaAs of InP of III-V group compound semiconductor is preferable in point of application. Further, the plane orientation of this semiconductor substrate may be in any direction in principle, but a particularly preferable plane orientation is either (110) or (111). In the case of this plane orientation, a whisker crystal grows perpendicularly to the substrate, thus producing tremendous advantage in point of application.

This preferable plane orientation is either just (110) or (111), however, it is a matter of course that misorientation of the plane within 5° from above-mentioned plane orientation is allowable.

A means for producing such a whisker is vapor phase chemical reaction by organometallic thermal decomposition. FIG. 43 is a schematic diagram showing a production method. An insulating film pattern 4 is formed on a substrate 403, and whiskers are grown selectively at window portions 405. At this time, a dimension of a window width D of the window provided on the insulating pattern 404 has to be set to approximately 0.1 μm, and the substrate temperature at the time of selective growth has to be set in a range of 350° to 480° C. (temperature at which ordinary thin film growth does not occur). The length (height) of the whisker crystal can be controlled by varying the raw material supply quantity and the growth time.

The operation of an optical microelectronic device according to the present invention will be described hereafter.

The present invention is based on the principle that light is generated by implanting carriers into a whisker crystal having a small diameter. In this case, the whisker crystal having a small diameter reveals a quantum confinement effect of carriers. Therefore, it is required that the whisker crystal has a size with the diameter at 1,000 Å and less which produces the quantum confinement effect. Further, the reason why a whisker crystal is employed is that crystal defects are essentially little and very high emission efficiency is obtainable.

Further, it is for the purpose of implanting carriers into a whisker that electric property is varied in the longitudinal direction of the whisker crystal, and to be concrete there are a method of changing from an n-type to a p-type and a method of changing from an n-type to a p-type through an i-type.

It is indispensable that the circumference of a whisker crystal for such a microelectronic device has electron affinity smaller than that in the case of the whisker material. This is for confining carriers in the whisker crystal effectively. Furthermore, when the circumference of the whisker crystal is not a semiconductor but an insulator, the electric lines of force of carriers expand less outside of the whisker crystal, and thus, the quantum confinement effect becomes noticeable. In other words, the material quality around the whisker crystal has an operation of amplifying the quantum confinement effect of carriers irrespective of the material whether a semiconductor or an insulator.

The reason why the plane orientation of the semiconductor substrate on which the whiskers are to be grown needs to be either (110) or (111) is that the axial orientation of the whisker crystal is either <110> or <111> and the whisker crystal grows perpendicularly to the substrate surface in the case of above-mentioned plane orientation.

The reason why the whisker crystal grows by organometallic vapor phase chemical reaction using an insulating film with windows is as follows. First, when a raw material gas reacts and reaches above the insulating film, that which adheres to the insulating film moves on the insulating film surface by thermal motion and vapor phase diffusion. During the process of movement, a new raw material is taken in from vapor phase, thus forming growth species. Growth species having larger dimensions are formed sometimes by nucleation of respective growth species.

These growth species reach the windows formed in the insulating film, adhere to the substrate surface and become nuclei. When the raw material is supplied further, crystal planes having a high growth speed extend preferentially from nuclei and become whisker crystals. The number, the thickness and the length of whisker crystals formed at the windows of the insulating film pattern can be controlled easily by the dimensions of the windows and the insulating film except windows, the ratio of D to d, the substrate temperature, the raw material supply quantity, the growth time, the crystal plane orientation of the substrate and the like.

BRIEF DESCRIPTION OF THE DRAWINGS

FIG. 38a and FIG. 38b are energy band diagrams of a quantum wire in the present invention, respectively.

FIG. 39a, FI. 39b.

DETAILED DESCRIPTION OF THE PREFERRED EMBODIMENTS

Embodiment 1

Figure 1:
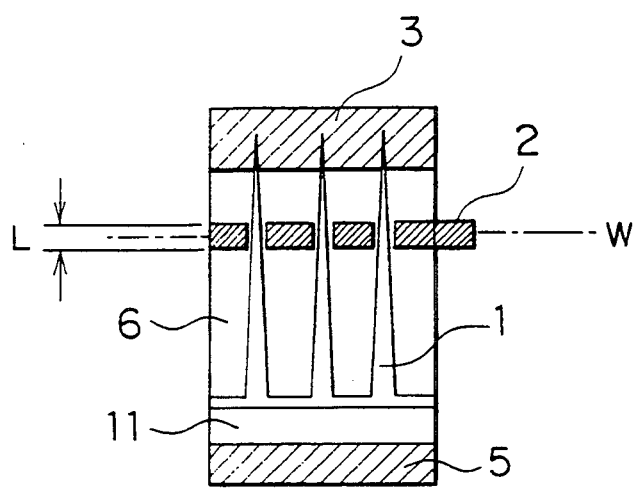
FIG. 1 is a sectional view showing a structure of an FET according to the present invention.
Figure 2:
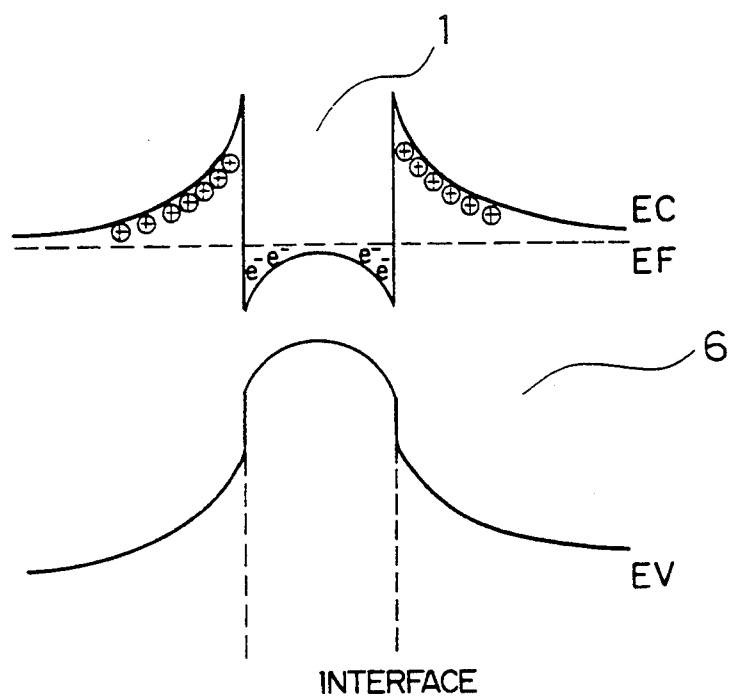
FIG. 2 shows a band diagram showing GaAsnAl-GaAs selective dope structure.
Figure 3:
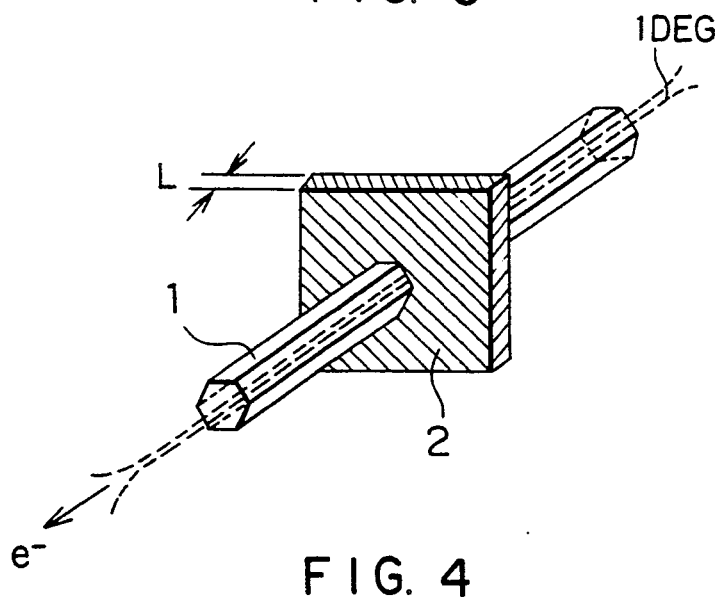
FIG. 3 is a view showing the part of a channel and a gate in FIG. 1.
Figure 4:
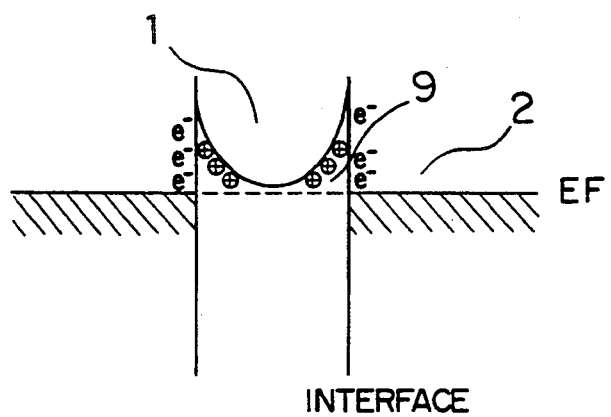
FIG. 4 a band diagram of a junction between a gate and a whisker channel.
Figure 5A:
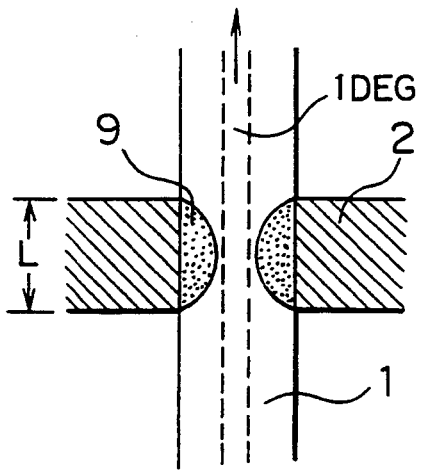
FIG. 5a and FIG. 5b are sectional views in a parallel direct Dn and a vertical direction with respect to the channel shown in FIG. 3, respectively.
Figure 5B:
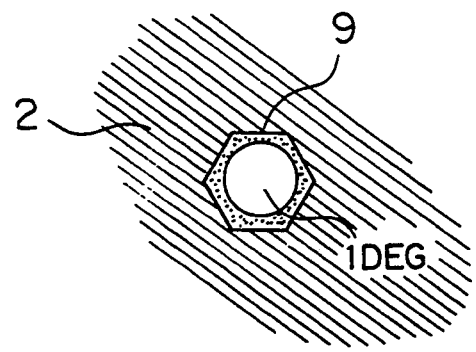
Figure 8:
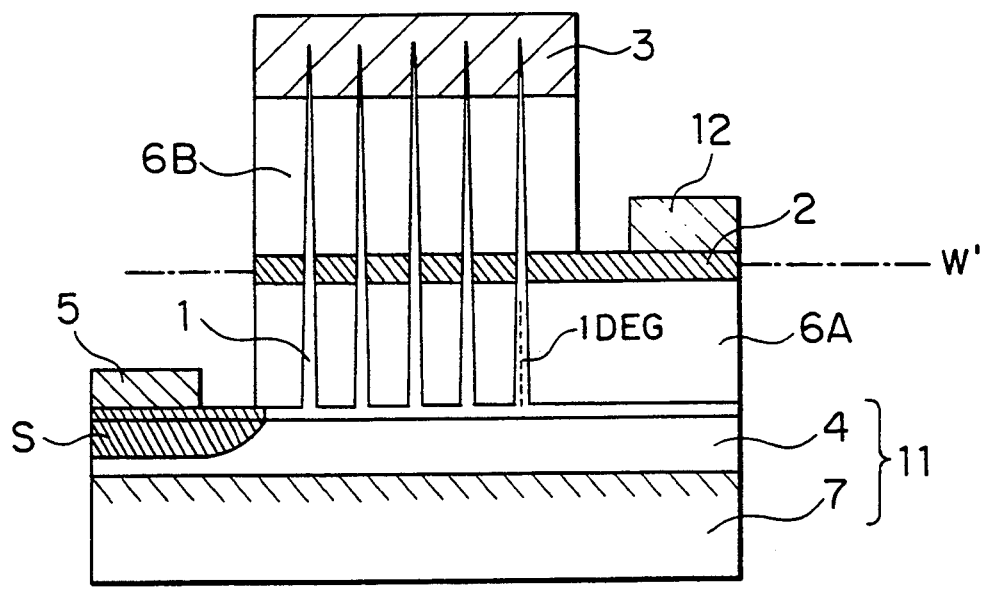
FIG. 8 is a sectional view showing the FET of an embodiment 1.
Figure 9:
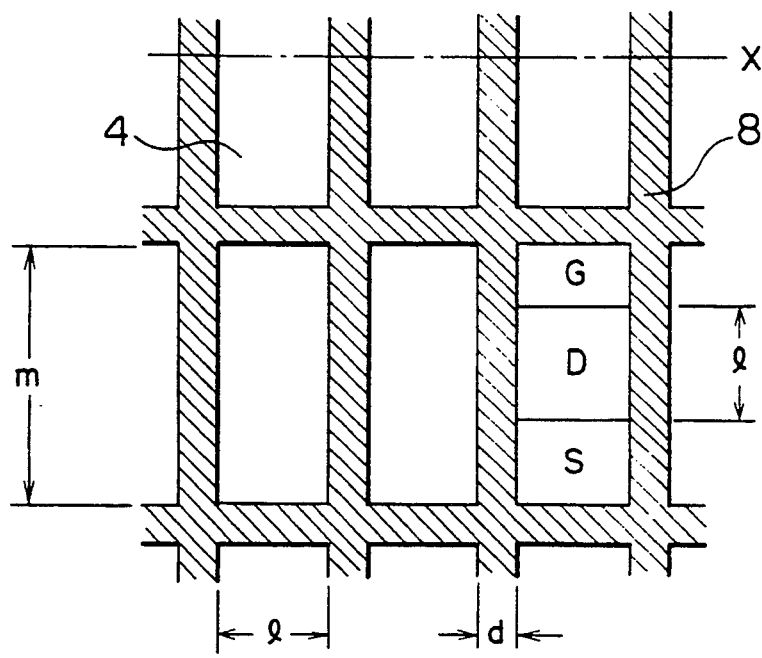
FIG. 9 is a plan view of an SiO2 pattern formed on the substrate.
Figure 10:
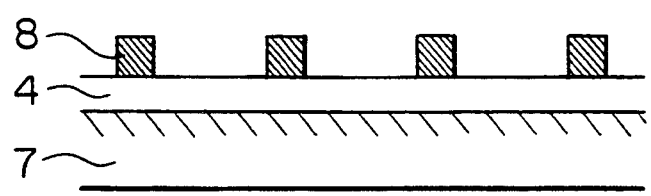
FIG. 10 is a sectional view at a portion X shown in FIG. 9.
Figure 11:
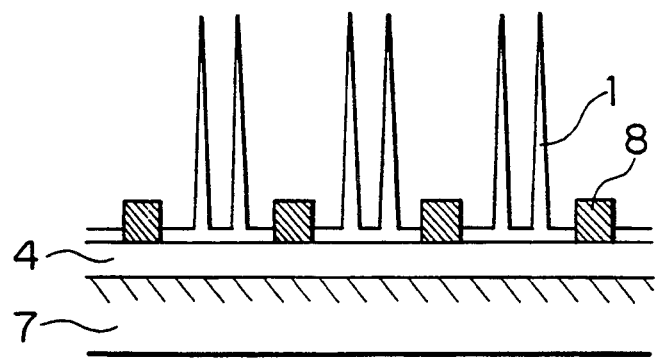
FIG. 11 is a sectional view similar to FIG. 10 when whiskers are grown on a substrate (111)B.
Figure 12:
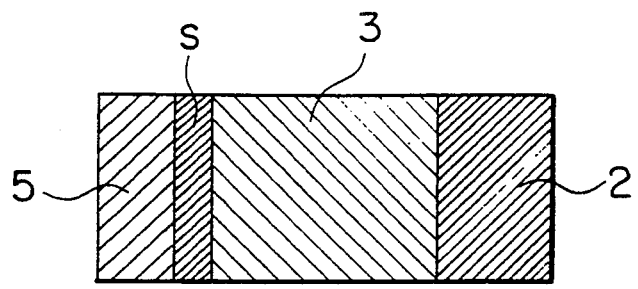
FIG. 12 is a plan view showing the upper part of FIG. 8.
Figure 13:
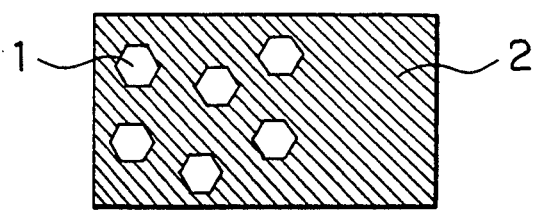
FIG. 13 is a sectional view taken at a position of a dotted line W in FIG. 8.

An embodiment 1 of the present invention will be described with reference to FIG. 8. First, an n-GaAs layer 4 having a carrier density $\simeq 1 \times 10^{18}/cm^3$ is formed on a GaAs semi-insulating substrate 7 of (111)B plane so as to form a conductive compound semiconductor substrate 11. Next, a SiO2 film is formed in the thickness of 0.3 μm on the n-GaAs layer 4 by thermal chemical vapor deposition (CVD). Then, a SiO2 film 8 is processed in a plane configuration having opening portions each in a rectangular shape shown in FIG. 9. FIG. 10 is a sectional view taken along a portion X shown with a dotted line. In the present embodiment, opening portions at 2 μm pitch (d) each having dimensions l=10 μm and m=22 μm are used. Each of these opening portions corresponds to one piece of a FET. As shown in a right part of FIG. 8, it is assumed here that a rectangular opening portion is divided into three portions S, D and G for convenience' sake. Next, undoped GaAs whisker channels 1 are grown selectively on the substrate by organometallic vapor phase growth (MOCVD method). It is possible to control density, length, outside diameter and the like of the whisker channel by growth conditions. Further, since these whisker channels have a property to grow in a direction <111>B, they grow vertically with respect to the substrate surface as shown in FIG. 11. Besides, in the present embodiment, the substrate temperature is set at 480° C., the raw material gas ratio of V group to III group (AsH$_3$ and TMG, respectively) is set at V/III=20, and the growth time is set to 200 sec. At this time, the density of the whisker 1 which has grown at the opening portion is $10^6$ lines/mm$^2$ and the length thereof is at approximately 1 μm. This whisker channel 1 has a configuration in which the outside diameter thereof is reduced gradually as approaching a tip from a root portion of the crystal, but the intermediate portion thereof which joins with a gate 2 has an almost uniform outside diameter of 400 Å. Then, in order to confine electrons in the whisker channel 1, an n-AlGaAs layer 6A having a carrier density of $5\times10^{17}$/cm$^3$ in the thickness of 0.5 μm is made to grow in a manner of burying the whiskers 'by MBE or MOCVD. At this time, since the n-AlGaAs-GaAs junction has a well known selective dope structure and has a band diagram such as shown in FIG. 2, electrons are confined in the whisker channels 1. Naturally, a GaAs crystal doped in an n-type may be grown as the whisker channel 1 and SOG (Spin on Glass) or polyimide and the like may be used as an insulator 6A, but the above-mentioned method is preferable in order to separate static-ionized impurities from electrons in the channel so as to increase electron mobility in the channel 1. Then, an n$^+$ InGaAs gate 2 having the film thickness of 500 Å is formed by MBE or MOCVD. The film thickness of 500 Å of this n$^+$ InGaAs gate 2 will be the gate length of the present FET. At this time, an interface structure between the gate 2 and the whisker channel 1 will appear as a Schottky junction such as shown in FIG. 4. Besides, a normal metal such as Au, Al and Pt may be used as the gate. In succession, n-AlGaAs similar to 6A is formed in the thickness of 0.2 μm as a confinement layer 6B. Next, Au—Ge—Ni is formed and applied with heat treatment as an ohmic drain electrode 3. Next, positive type resist is applied onto the surface thereof in the thickness of 1.1 μm, and the resist is removed only at the portion S at the opening portion shown in FIG. 9 using a photomask so as to remove it until the conductive layer 4 appears by combining wet etching, dry etching and ion milling. Then, a high impurity density layer is formed using ion implantation, which is used as the source portion S. Then, resist is applied again, and the resist is removed this time only at the portion G so as to remove it by wet etching and dry etching until the gate 2 is reached. Further, resist application and lithography are performed again, and the resist is left only at the portion D and a partial region of the areas S and G which are connected to the portion D, and the resist in other regions is removed. Next, Au—Ge—Ni is formed in the thickness of 0.3 μm by vacuum deposition. Excessive Au—Ge—Ni film formed on a drain electrode and the like is removed by lift-off, and a source electrode S, a drain electrode 3 and a gate electrode 12 are formed. With this, an FET according to the present invention shown in FIG. 8 is completed. FIG. 12 is a plan view of the present FET seen from above, and FIG. 13 is a sectional view when the gate 2 is cut at a position shown with a dotted line W. Incidentally, FIG. 13 is shown assuming that the sectional configuration of the whisker channel 1 is a regular hexagon, but this is a feature obtained generally in a whisker. This sectional configuration may also be made to be a circle under appropriate growth conditions.

An important factor for determining electron mobility in a crystal at a low temperature exists in the quality of crystal thereof and a magnitude of elastic scattering probability in the crystal depending on ionized residual impurities and the like. It has been found through analysis with an electron microscope that the whisker used as the channel has a very high quality of crystal including no dislocation, and further, elastic scattering caused by ionized impurities and the like in a one-dimensional electron gas is suppressed sufficiently as described previously. Accordingly, very high electron mobility is achieved in the whisker. Furthermore, in an FET according to the present embodiment, the gate 2 is formed so as to surround the whisker channels 1 as shown in FIG. 8 and FIG. 13. Therefore, the film thickness of the gate corresponds directly to the gate length L, thus achieving a very short gate length. As the most important parameter for determining the high speed performance of an FET, the transconductance $$gm\left(=\frac{\partial I_{SD}}{\partial V_G}\right)V_{SD}$$

expressing a drain current amplification factor on the increase of the gate voltage may be mentioned. gm has a relationship $$gm \propto \frac{\mu}{L}$$

with the gate length L the electron mobility μ. Therefore, very large gm may be achieved by increasing μ in the channel and shortening the gate length L. Thus, it is realized that the FET according to the present embodiment is suited for increasing the high speed performance in the operation speed.

Figure 14:
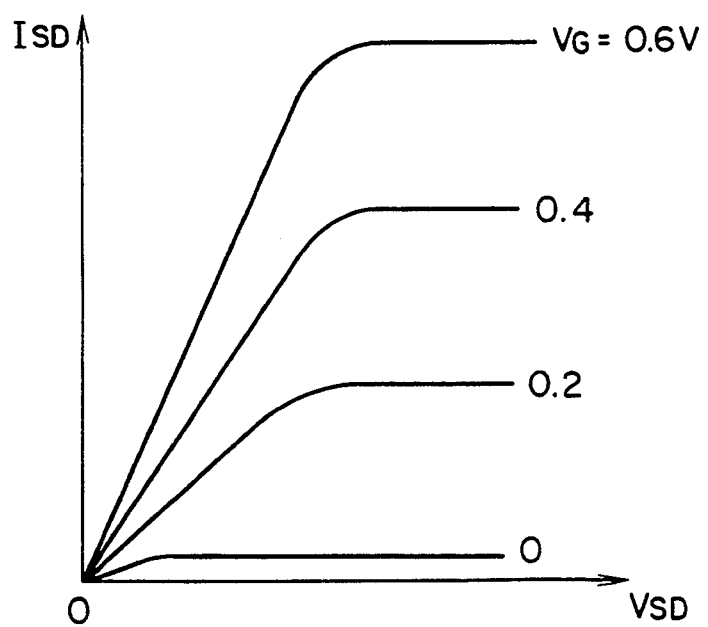
FIG. 14 is a $I_{DS}-V_{DS}$ characteristic diagram of the embodiment 1.

Incidentally, GaAs is principally used in the production of an FET in the present embodiment, but there is naturally no problem in using other compound semiconductors such as InAs and InP of a binary system of InGaAs of a ternary system. FIG. 14 shows $V_{DS}-I_{DS}$ characteristics at 77K of an FET produced according to the present embodiment. Here, the $V_{DS}-I_{DS}$ characteristics show excellent FET characteristics measured in a wafer state, and very high transconductance which is not obtainable in an ordinary high integration FET has been obtained. Thus, it has been displayed that the FET in the present embodiment has excelleng high speed characteristics.

Embodiment 2

Next, another embodiment 2 will be explained with reference to FIG. 15. An n-type GaAs layer 4 is formed in the thickness of 0.5 μm by MBE or MOCVD on a semi-insulating GaAs substrate 7 in a similar manner as the embodiment 1. Next, a $SiO_2$ film in the thickness of 0.3 μm having a square window pattern of d=1 μm and l=m=10 μm is formed on the n-type GaAs layer 4 by a method similar to that in the embodiment 1. The whisker channel 1 is grown in the next place, however, n-type InAs is used as the material in the present embodiment. The growth conditions of the InAs whisker 1 are set such that the growth temperature is 420° C., the ratio of V group raw material gas to III group raw material gas ($AsH_3$ and TMI) is V/III=360, and the growth time is 200 sec. The length of the grown InAs whisker 1 is approximately 1 μm, the density thereof is $10^6$ lines/mm$^2$, and the outside diameter of the intermediate portion thereof which is in contact with the gate 2 is approximately 400 Å.

Figure 6:
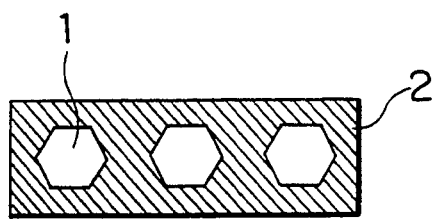
FIG. 6 is a sectional view in which Schottky junction gate of the FET shown in FIG. 1 is cut along a dotted line W.
Figure 7:
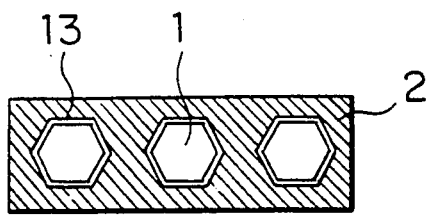
FIG. 7 is a view similar to FIG. 6 in the case of a gate having MIS structure in which an insulator is put between a channel and a gate.
Figure 15:
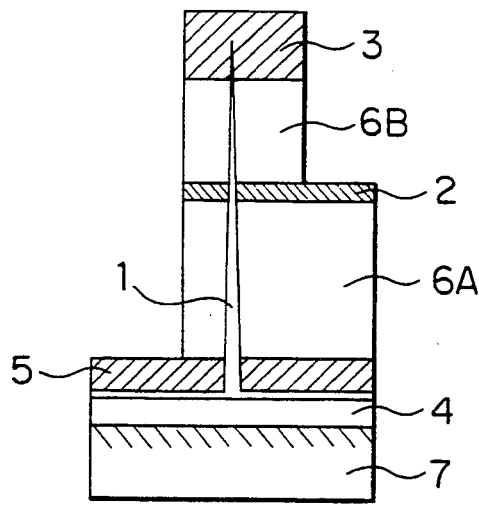
FIG. 15 is a sectional view of an FET of an embodiment 2.

Next, in the present embodiment, a source electrode 5 is formed in the film thickness of 0.2 μm so as to surround the whisker channel 1 as shown in FIG. 15. In this case, n+ InAs is used as the material of the source electrode 5. Then, an insulator layer 6A is formed in the film thickness of 0.5 μm. SOG (Spin on Glass) or polyimide having low viscosity is used as the insulator in this case. Furthermore, Au having the film thickness of 500 Å is deposited as the gate 2 so as to surround the whisker channel 1 in the similar manner as the embodiment 1. Here, when the whisker channel 1 is buried with above-mentioned insulator layer 6A, the whisker channel 1 above the original buried region is also covered with a thin SOG at 100 Å and less. As a result, the junction between the gate 2 and the whisker channel 1 has a MIS structure such as shown in FIG. 7, but the current control mechanism using a depletion layer is similar to the case of Schottky junction shown in FIG. 6.

Thereafter, an SOG layer 6B in the thickness of 0.3 μm and a drain electrode 3 with Au—Ge—Ni are formed. Furthermore, a configuration such as shown in FIG. 15 is completed by combining photolithography and etching with each other in the similar manner as the embodiment 1. The $V_{DS}-I_{DS}$ characteristic of the present FET also shows an FET characteristic similar to that shown in FIG. 14, in which very high transconductance has been achieved. In the present FET, a whisker composed of InAs is used as the channel, and large lattice mismatch of 7.4% is produced with respect to GaAs of the substrate. However, the whisker has such a feature that no defect caused by lattice mismatch is involved. Thus, it is possible to obtain an excellent device even in a hetero junction system having large lattice mismatch such as the present embodiment.

As described above, it has been found that the FET according to the present embodiment shows excellent high speed performance with high transconductance.

Figure 16A:
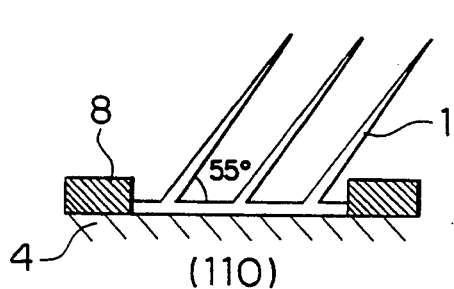
FIG. 16a and FIG. 16b are views showing inclinations with respect to the substrate surface when whiskers are grown on substrates having a plane (110) and a substrate having a plane (211), respectively.
Figure 16B:
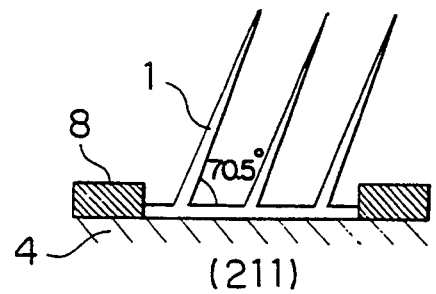

Incidentally, a substrate (111)B has been used in above-described two embodiments, but similar characteristic is obtainable when a substrate having another plane orientation such as (110) and (211) is used. At this time, however, the direction of the growth of the whisker which becomes the channel varies depending on the plane orientation of the substrate used in such a manner that the orientation is at 55° with respect to a substrate shown in FIG. 16a on a plane (110) and at 70° as shown in FIG. 16b with respect to a plane (211).

Since the channel extends in a vertical direction (not necessarily 90° ) with respect to the substrate in the FET according to the present invention, it is possible to reduce the device area than an ordinary FET as shown in the above-mentioned embodiment, thus very high integration may be expected.

Embodiment 3

Figure 17:
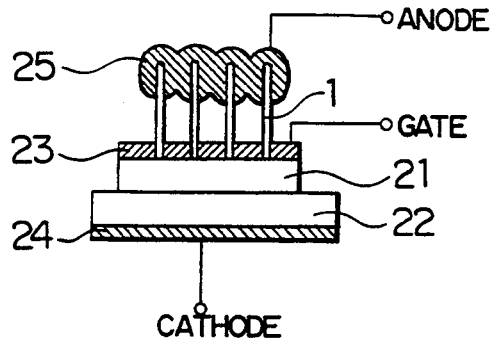
FIG. 17 is a sectional view of a ballistic transistor in an embodiment 3.

FIG. 17 shows an embodiment of a device structure of a ballistic transistor according to the present invention. FIG. 17 shows a case of a single microelectronic device, in which an undoped GaAs layer 21 is grown in the thickness of 0.02 to 0.1 μm on an n-type GaAs substrate 22 doped with donor impurities in high density, and undoped GaAs whisker channels 1 having a diameter of approxiamtely 0.1 μm and a length of 0.5 μm or more is grown thereon. An ohmic metal 24 is deposited on the underside of the GaAs substrate 22 as a cathode electrode, and a Schottky metal 23 is deposited in the thickness of approximately 0.1 μm at the tail of the whisker channels 1 as a gate electrode. An ohmic metal 25 is provided at the whisker channel portion which is apart from the gate electrode by approximately 0.1 μm as an anode electrode, thereby to complete the ballistic transistor. In the figure, the whisker channels are formed vertically to the substrate, but it is only required to be perpendicular to the substrate and the whisker channels may also be formed obliquely. Undoped GaAs has been used for the GaAs layer 21 and the whisker channels 1, but donor impurities may be doped in the order of $1\times 10^{14}-10^{16}/cm^3$ in order to reduce the channel resistance.

It is possible to use Au, AuZn, AuGe, Cu, In, N+-$Al_xGa_{1-x}As$, N+-$In_xGa_{1-x}As$ and the like for ohmic metals 24 and 25, and to use Ti, Pt, Al, Mo, W, TiW, Wal, $WSi_x$, $MoSi_x$, $CoSi_x$ and the like for the Schottky metal 23.

It is possible to form a device by using Ce or Si for the n-type semiconductor substrate 22 and having a compound semiconductor grow heteroepitaxially thereon. Further, GaAs has been used as the compound semiconductor for explanation purpose in the present embodiment, but another compound semiconductor such as InAs, InGaAs and InSb may be used.

Figure 18:
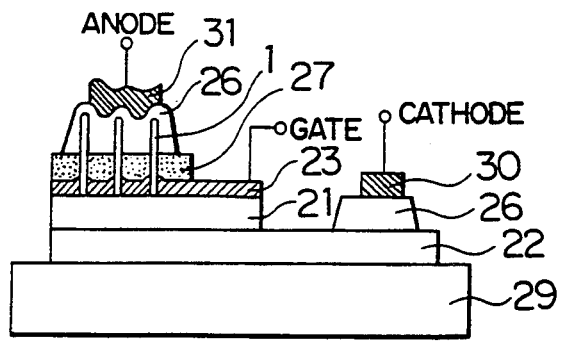
FIG. 18 is a sectional view of a ballistic transistor which is suitable for integration.
Figure 19A:
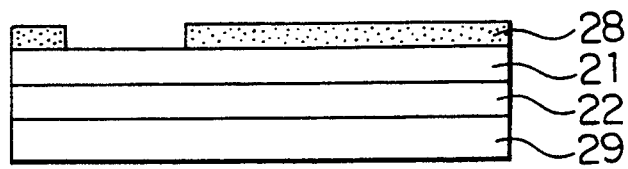
FIG. 19a through FIG. 19f are manufacturing process drawings for FIG. 18.
Figure 19B:
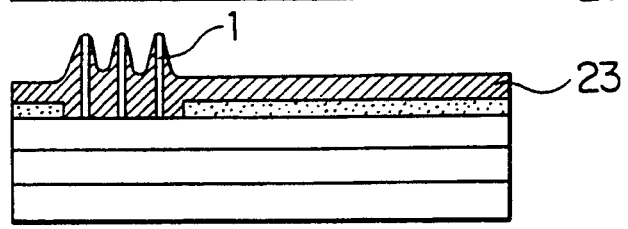
Figure 19C:
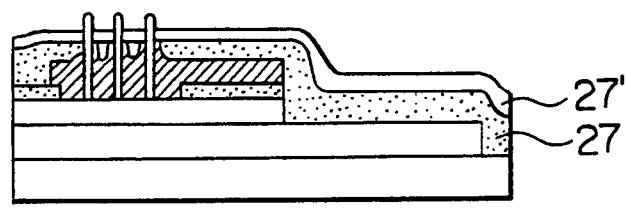
Figure 19D:
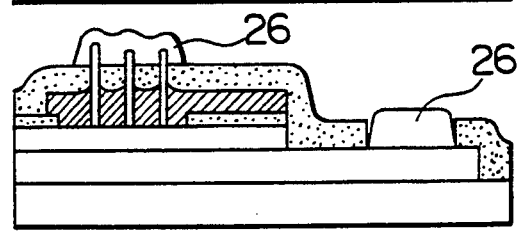
Figure 19E:
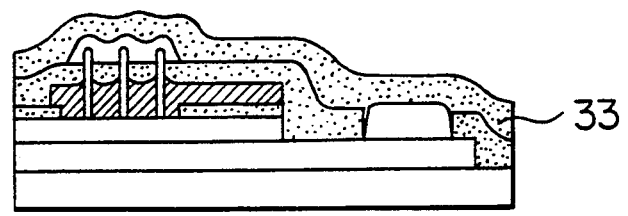
Figure 19F:
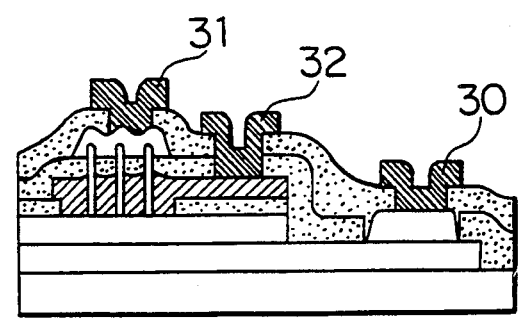

It is also possible to use a different type of compound semiconductor for the compound semiconductor layer 21 and the whisker channels 1. For example, it is possible to use an $In_xGa_{1-x}As$ inclined composition layer (GaAs on the substrate side) for the compound semiconductor layer 21 and InGaAs or InAs for the whisker channels 1 or to use GaAs for the compound semiconductor layer 21 and $In_xGa_{1-x}As$ compositionally graded layers (GaAs on the substrate side) for the whisker channels 1 and no forth. FIG. 18 shows a device structure in case of being used as anintegrated circuit. An n-type semiconductor having a carrier density in the order of $1\times 10^{14}-10^{16}/cm^3$ may be used for the compound semiconductor layer 21 other than an undoped semiconductor. In order to reduce contact resistance between the whisker channel and the anode electrode, an insulating film 27 is adhered in the thickness of 0.1 μm after forming the gate electrode 23, and the circumference of whisker channels 1 projecting from an insulating film 27 is covered with an n+-$In_xGa_{1-x}As$ compositionally graded layers (InAs on the outside) 26 doped with donor impurities at high density so as to utilize it as a nonalloyed ohmic layer.

FIG. 19a through FIG. 19f show a manufacturing method of the device shown in FIG. 18. A case of GaAs will be explained for the sake of simplicity, but it is possible to use other compound semiconductors.

(a) An n+-GaAs layer 22 ($3 \times 10^{18}$/cm$^3$) is accumulated in the thickness of 400 nm and an n-GaAs layer 21 ($1 \times 10^{15}$/cm$^3$) is accumulated in the thickness of 100 nm on a semi-insulating GaAs substrate 29 by molecular beam epitaxy (MBE), a prototype of a microelectronic device is formed by etching, and a SiO$_2$ film 28 is coated in the thickness of 50 nm, and the SiO$_2$ film 28 is removed thereafter in the whisker channel forming region so as to expose a GaAs interface.

(b) Whiskers 1 composed of n-GaAs ($5 \times 10^{14}$/cm$^3$) are formed on the exposed GaAs interface by organometallic chemical vapor phase deposition (MOCVD). The whisker 1 has a diameter of approximately 0.1 μm and a length of 0.5 μm and more. Thereafter, a Schottky metal (WSi$_x$) 23 is adhered in the thickness of 0.1 μm by sputter deposition.

(c) After processing the Schottky metal 23, non-electrical insulators (SOG or polyimide) 27 are applied in the thickness of 0.05 μm, and the Schottky metal 23 adhered to the whiskers at the portion projecting from the insulators 27 is removed by dry etching. Thereafter, non-electrical insulators 27' are applied again in the thickness of 0.05 μm.

(d) After removing insulators 27 and 27' in the cathode electrode forming region, an n+-In$_x$Ga$_{1-x}$As compositionally graded layers 26 (x=0.8 on the substrate side, x=1.0 on the outside, and carrier density: $5 \times 10^{18}$/cm$^3$) is grown epitaxially selectively by MOCVD in the thickness of 0.2 μm as a nonalloyed ohmic layer, and InAs (carrier density: $5 \times 10^{18}$/cm$^3$) is grown further selectively in the thickness of 0.2 μm.

(e) SiO$_2$ is coated in the thickness of 0.2 μm as an intermediate insulators 33.

(f) The intermediate insulators 33 are removed in the region where the electrode is taken out, and an interconnect metal (Al or Au) is deposited by sputtering and processed so as to form interconnections 30, 31 and 32, thereby to complete the present embodiment.

Embodiment 4

Figure 20:
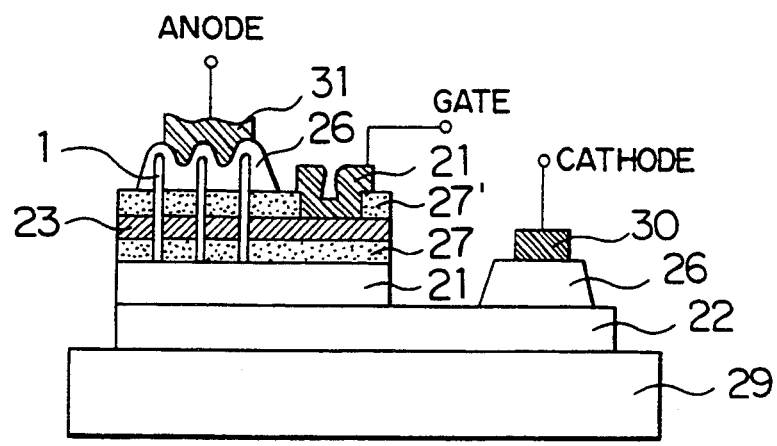
FIG. 20 and FIG. 21 are sectional views of ballistic transistors for integration in an embodiment 4 and an embodiment 5, respectively.

A gate electrode has been formed at the tail of the whisker channel in the device structure shown in FIG. 18, but it is also possible to provide a gate electrode in an intermediate part of the whisker channel, and an embodiment in such a case is shown in FIG. 20. After the whiskers 1 are formed on a compound semiconductor layer 21 (carrier density: $1 \times 10^{16}$/cm$^3$, film thickness: 0.05 μm), non-electrical insulators 27 are applied in the thickness of 0.05 μm, and, after depositing the Schottky electrode 23 in the thickness of 0.1 μm and processing it as a gate electrode, nonelectrical insulators 27' are applied in the thickness of 0.05 μm so as to form a nonalloyed ohmic layer 26. In the present device structure, it is difficult to abridge the channel length, but, on the other hand, there is such an advantage that the parasitic capacitance of the gate electrode may be reduced lower than that in the case of the embodiment 3.

Embodiment 5

Figure 21:
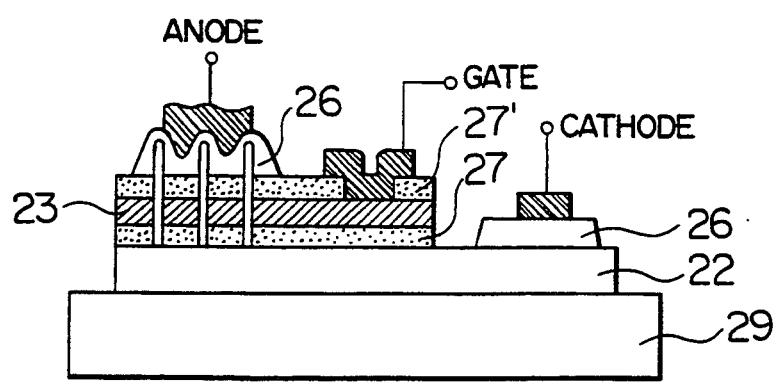
Figure 22A:
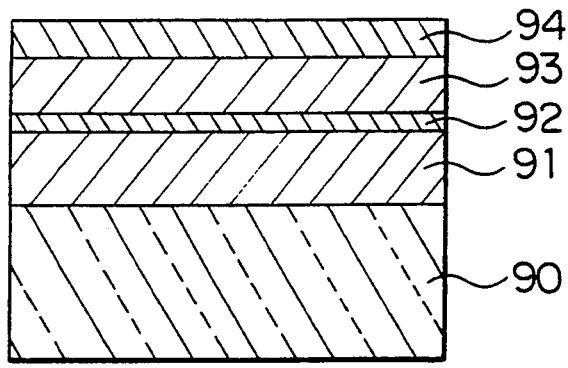
FIG. 22a through FIG. 22c are drawings showing production process of a whisker according to the present invention.
Figure 22B:
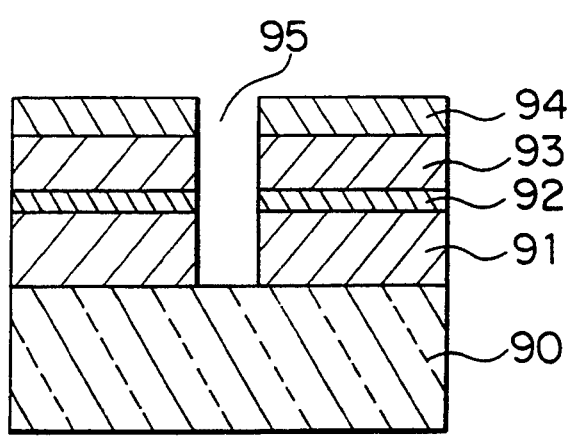
Figure 22C:
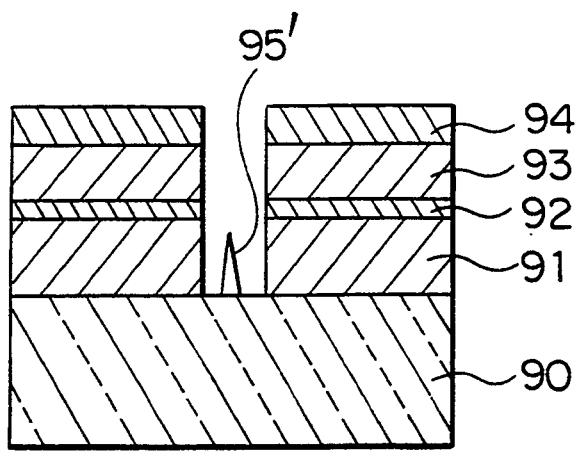

When the carrier density of the compound semiconductor layer 21 is made high, it becomes possible to commonly use the layer 21 with the n-type semiconductor layer 22. An embodiment in this case is shown in FIG. 21. In the present device structure, there is such a drawback that the parasitic capacitance between the n-type semiconductor layer 22 and the gate electrode 23 is increased. Thus, it is required to make the thickness of the non-electrical insulator 27 in a first layer to be 0.15 μm and more in order to reduce the parasitic capacitance between the n-type semiconductor layer 22 and the gate electrode 23 and to avoid diffusion of donor impurities from the n-type semiconductor layer 22 to the whisker channels 1.

According to embodiments 1 to 5, elastic scattering of electrons in the channels is suppressed and electron mobility is increased by a large margin because of good quality of crystal and the effect of forming the electron gas in one dimension by using whiskers as the channel. Accordingly, it is possible to make the transconductance very high in the case of an FET in keeping with the above.

Further, these whiskers have a feature that no defect is included inside thereof even when the whiskers are grown on a semiconductor substrate having large lattice mismatch. Accordingly, a hetero junction system which has been heretofore considered inappropriate for a device can be applied.

Furthermore, in an FET according to the present invention, it is possible to have the film thickness of the gate correspond directly to the gate length and to achieve a very short gate length at 0.1 μm and shorter.

Further, it has been difficult for a conventional ballistic transistor to operate at room temperature due to a restriction by element dimensions. According to a ballistic transistor of the present invention, however, there is an effect that operation at room temperature becomes easy by means of an effect that the channel length can be shortened and an effect that the mean free path of electrons becomes longer.

Since it is possible to use a material which is different from that of substrate materials for the whisker channels, such an effect is obtainable that device performance may be improved by using materials having large electron mobility such as InAs and InGaAs for the whisker channels. Further, an element semiconductor such as Si and Ge may be used as the whisker.

Embodiment 6

A semiconductor vacuum microelectronic device of an embodiment 6 will be explained with reference to FIG. 23.

A SiO$_2$ insulator 111 was deposited by the CVD on a (111)B plane oriented substrate 110, which is doped with Si to be of n-type conductivity, to a thickness of 1 μm, and thereafter, a Mo metal 112 was deposited to a thickness of 0.2 μm by vacuum deposition, a SiO$_2$ insulator 113 was deposited again to a thickness of 0.5 μm by CVD, and a metal W 114 was deposited to a thickness of 0.1 μm by vacuum deposition.

Next, a hole is bored through above-mentioned four layer deposits 111 through 114 by photolithography. In the process of boring the hole, it is possible to make the diameter d of the hole in metals 112 and 114 a little smaller than the hole in insulators 111 and 113 by applying dry etching to the metals 112 and 114 and combining dry etching and wet etching on insulators 111 and 113. The diameter d of the formed hole was 0.3 μm.

Figure 49:
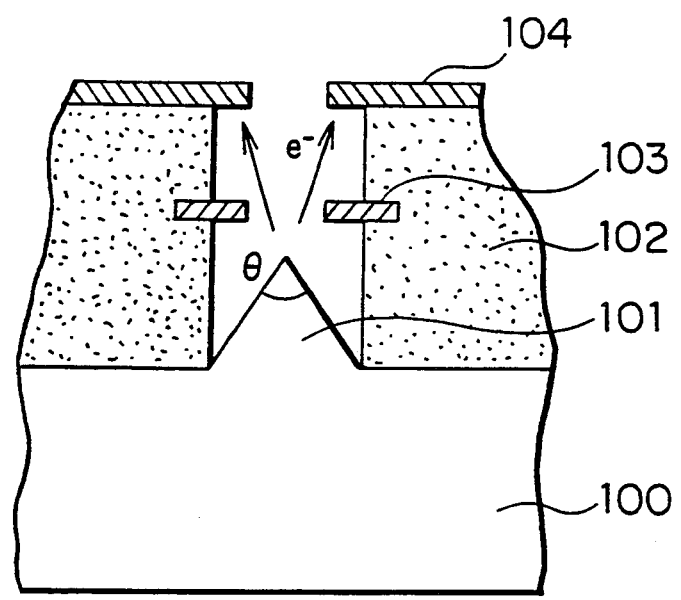
FIG. 49 is a sectional view of a conventional Si vacuum microelectronic device.
Figure 50:
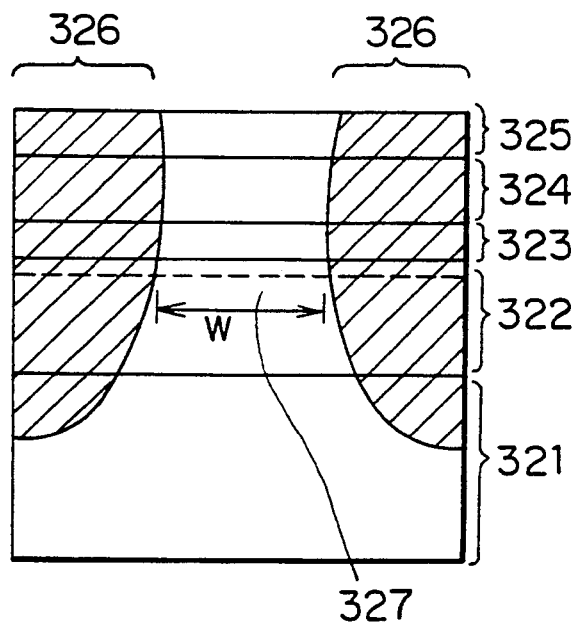
FIG. 50 is sectional view of a conventional quantum wire.
Figure 51:
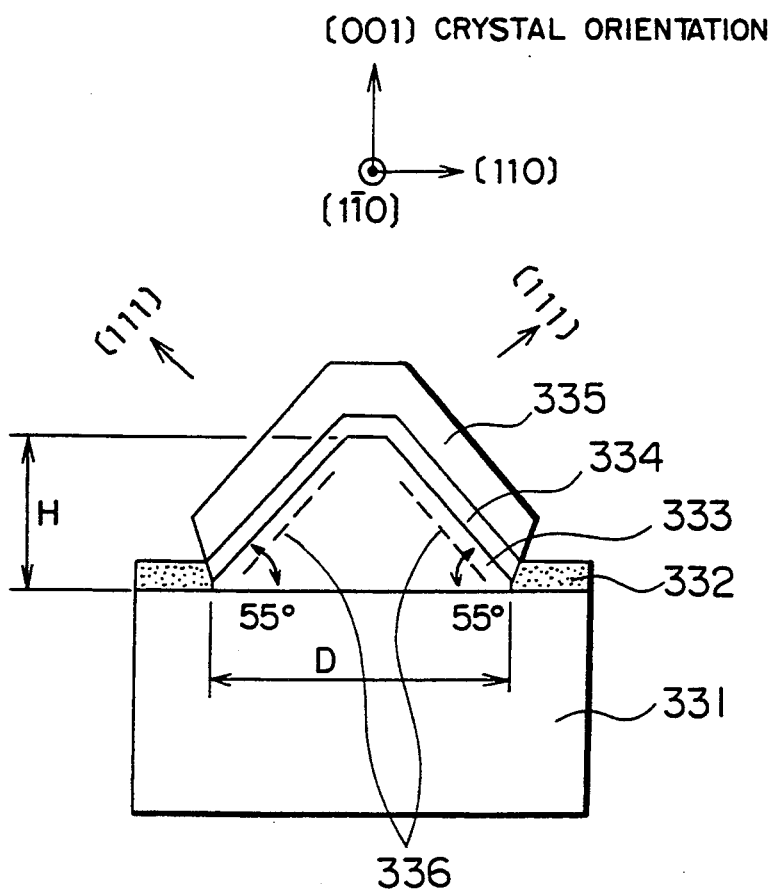
FIG. 51 is a sectional schematic diagram of a conventional quantum wire.

Next, a GaAs whisker 115 is grown perpendicularly to the substrate surface by organometallic vapor phase growth. Here, the growth conditions of whiskers are such that the substrate temperature is 380° C., the growth time is 300 seconds, a gas of trimethylgallium (TMG) or triethylgallium (TEG) is used as the III group Ga raw material, and a gas of triethylarsenic (TEAs) is used as the V group As raw material. A whisker which has been grown under above-described growth conditions had a length (height) of 0.6 μm, a thickness at a root portion of 0.1 μm, an angle $\theta$ at a tip (which corresponds to $\theta$ in FIG. 49) of 5°, and a radius of curveture at the tip of 10 nm.

When a potential difference at 70 V is applied between an emitter and an anode and a potential difference at 30 V is applied between an anode and a gate with a GaAs whisker 115 as the emitter, a metal 112 as the gate and a metal 114 as the anode, 100 to 500 microamperes as a radiating current from the emitter and transconductance at 100 to 600 microsiemense were observed.

Embodiment 7

A single microelectric device has been described in the embodiment 6. In the present embodiment, a plurality of microelectric devices are formed on the same substrate so as to form a three polar vacuum microelectronic device array, thereby to improve the current driving capability as the whole microelectronic device.

Figure 24:
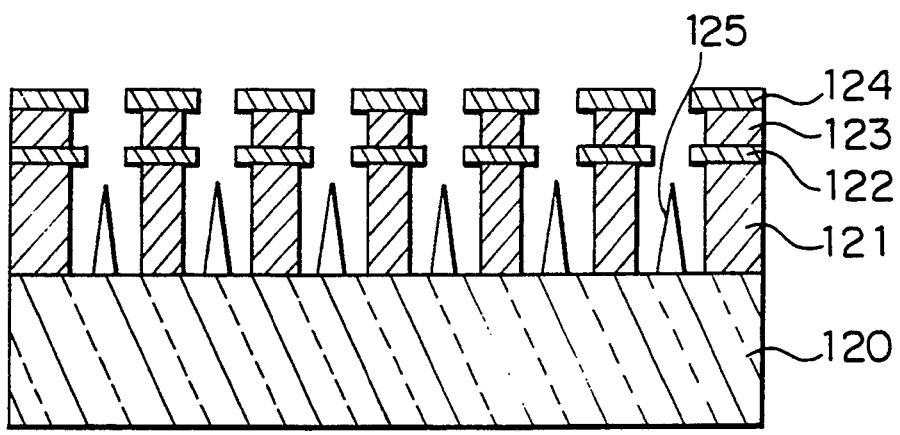
FIG. 24 is a sectional view of a three polar vacuum microelectronic device array in an embodiment 7.

In FIG. 24, GaAs whiskers are used as emitters 125, and metallic gates 122 and metallic anodes 124 are produced similarly to the embodiment 6, respectively. In the microelectronic device array shown in FIG. 24, the emitter electrodes 125 are arranged in a checkers configuration on a substrate 120 at intervals of 120 μm.

When a potential difference at 100 V was applied between the emitters and the anodes and a potential difference at 70 V was applied between the gates and the anodes in the microelectronic device array, the radiation current from the emitters reached $10^5$ amperes/cm$^2$ per unit area of the microelectronic device and a sharp increase in current driving capability was observed as compared with a single microelectronic device.

Furthermore, modulation and amplification at 1,000 gigahertz (1 terrahertz) are feasible with respect to the high speed operation characteristic of the microelectronic device due to short electron drift time at 0.1 picosecond between the emitters and the anodes.

Embodiment 8

The whiskers were integrated as cold-cathode emitters, thereby to produce a plane color display.

Figure 25:
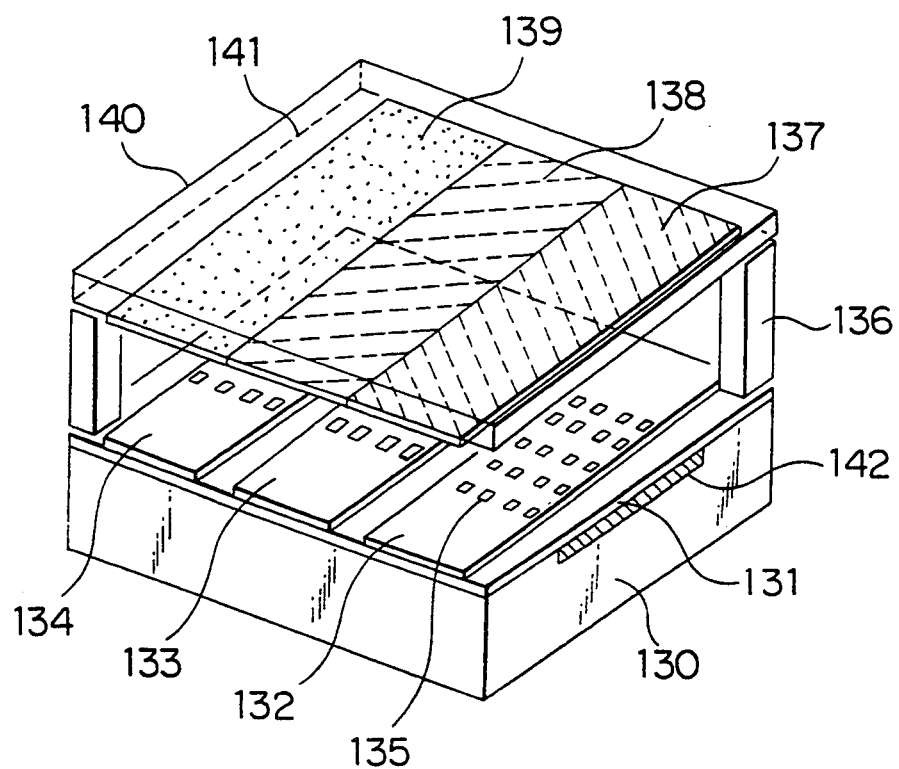
FIG. 25 is a perspective view showing a picture element portion of a color display in an embodiment 8.

FIG. 25 is a perspective view showing a structure of a picture element portion of the present color display. Gate electrodes 132, 133 and 134 are arranged through an insulating film 131 on a substrate 130 having a base portion 142 provided with conductivity by ion implantation. Rectangular windows where the emitters are formed are formed on these gate electrodes and the insulating film 131, which form electron emitting cells 135. Fluorescent screens 137, 138 and 139 are formed on a glass plate 140 opposing to respective gate electrodes 132, 133 and 134. A transparent electrode film 141 is formed between the fluorescent screens 137, 138 and 139 and the glass plate 140. The transparent electrode film 141 is obtained by coating indium and tin oxides (ITO), and is used as an anode. The glass plate 140 is kept apart from the emitters or the gate electrodes by about 50 μm using pole braces 136 so that insulation between electrodes may be maintained even when a potential difference at 1,000 V is generated between the anode and the emitter.

Figure 26:
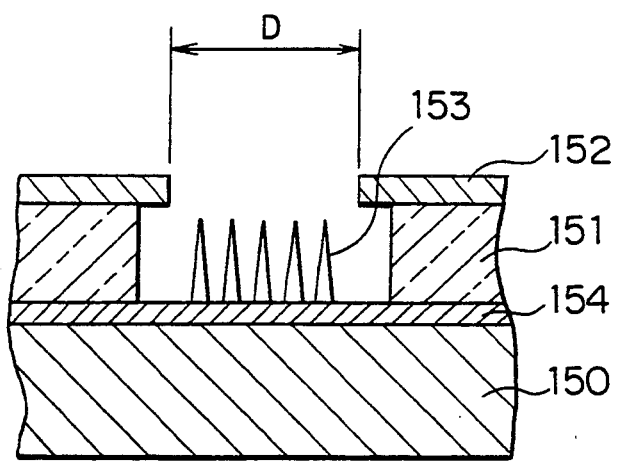
FIG. 26 is a sectional view of an electron emitting cell shown in FIG. 25.

FIG. 26 is a schematic diagram showing a sectional structure of an electron emitting cell 135 on which a cold-cathode emitter is formed. A base portion 154 provided with n-type conductivity by ion implantation is formed on a substrate 150, a SiO$_2$ insulating film 151 is accumulated thereon in the thickness of 1 μm, and then a metal W which becomes a gate electrode 152 is adhered in the thickness of 0.1 μm by sputtering. Next, an opening portion is provided in the metal W and the insulating film by photolithography. When the opening portion of the metal W has a square having a dimension of one side at D, the SiO$_2$ insulating film 151 is applied with lateral overetching by wet etching so that the opening portion thereof becomes larger than D.

In the present embodiment, D=10 μm. Next, GaAs whiskers were grown in the opening portion by organo-metallic thermal decomposition. Each of the whiskers has a length of 0.5 μm and the thickness at the root of 0.1 μm, and whiskers have grown at a rate of 100–150 pieces in a square opening portion. Each of the whiskers acts as an emitter, but stabilized current emission is made to be obtainable as the whole emitters by increasing the number thereof as in the present embodiment. That is, color shade of the display itself may be prevented by stabilizing emission current from the emitters.

Figure 27:
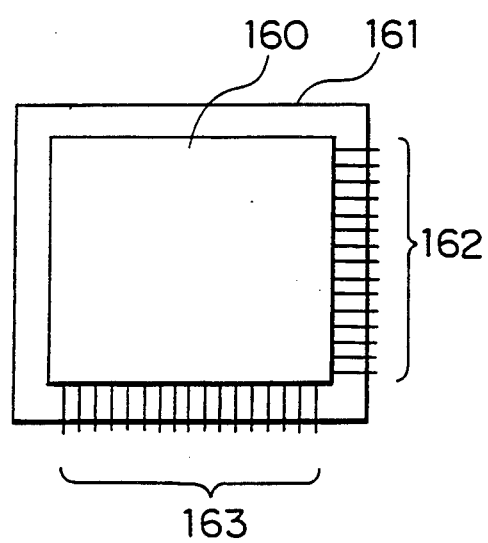
FIG. 27 is a plan view of a color display in which a plurality of picture elements shown in FIG. 25 are integrated.

FIG. 27 is a plan view of a color display in which a plurality of picture element portions shown in FIG. 25 are integrated. A display plane 160 is a square 5 cm by 5 cm, and a base electrode column 162 and a gate electrode column 163 are formed along the peripheral portion thereof. However, the dimension of the display plane is not limited to the present embodiment, but is applicable up to the upper limit of the dimension usable in a photolithography process.

In the present color display, whiskers are used for emitter electrodes, which provide high electron radiation efficiency, and 100 pieces and more of whisker emitters are provided in one electron emitting cell 135. Thus, it is possible to realize a high luminance color display with a drive voltage at 10 to 20 V.

Embodiment 9

Figure 28:
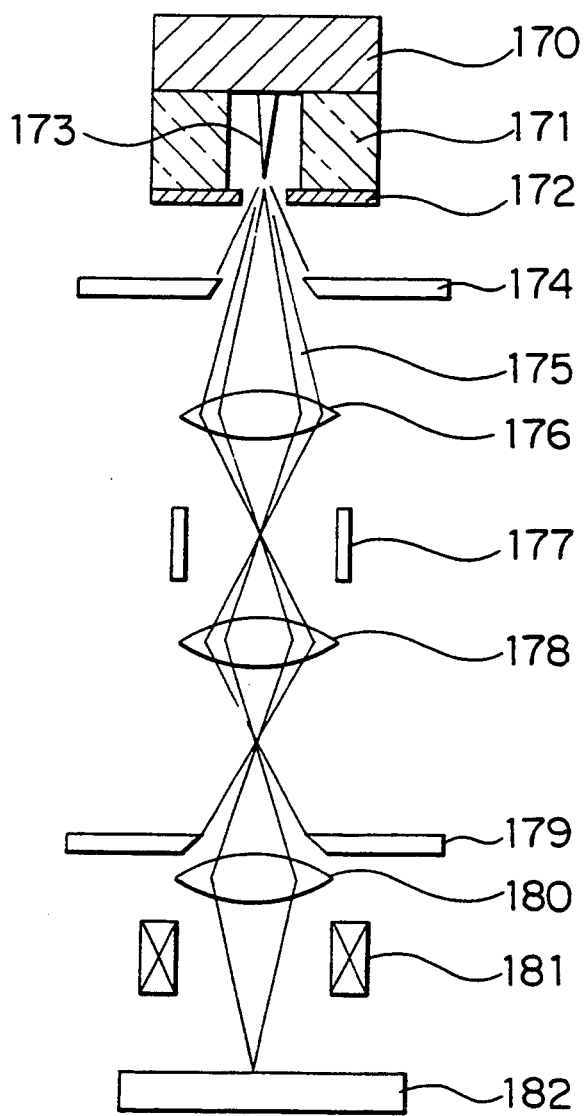
FIG. 28 is a schematic diagram showing an electron beam convergent system which is constructed by incorporating an electron gun in an embodiment 9.

A whisker is applied to an electron gun as an electron emitting emitter. FIG. 28 shows schematically a construction of an electron beam convergent system in which the electron gun is incorporated. Here, an emitter 173 is a portion composed of a whisker. The manufacturing process which has been described with reference to FIG. 23 may be applied to forming of the emitter 173. The use as an electron gun is also applicable to an electron source of an electron beam diffraction apparatus and an electron beam exposure device other than the above-mentioned.

Embodiment 10

Figure 23:
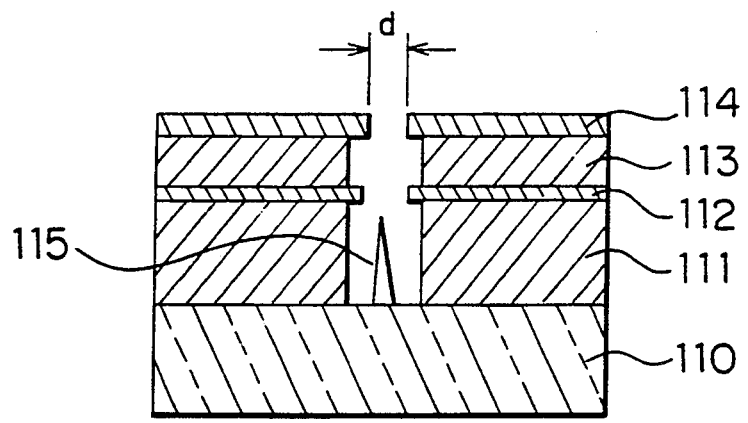
FIG. 23 is a sectional view of a semiconductor vacuum microelectronic device in an embodiment 6.
Figure 29:
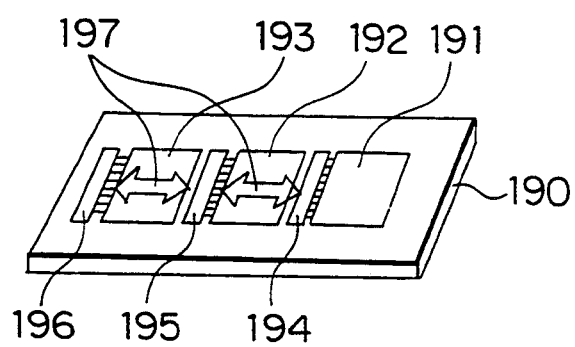
FIG. 29 is a schematic diagram of a large scale integrated circuit substrate using a semiconductor vacuum microelectronic device in an embodiment 10.
Figure 30:
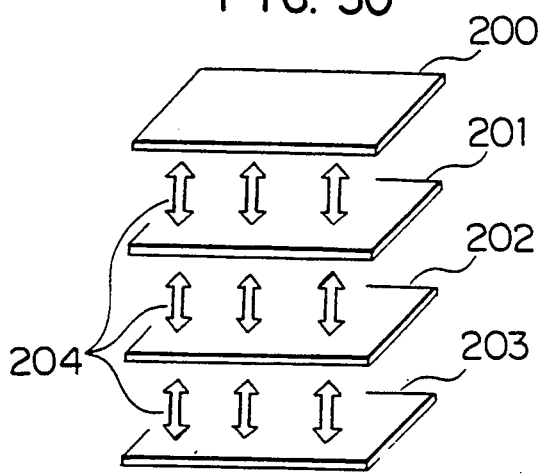
FIG. 30 is a schematic connection diagram between integrated circuit substrates in FIG. 29.

A vacuum semiconductor microelectronic device similar to that shown in FIG. 23 was produced using whiskers as colod-cathode emitters and used in a circuit connecting portion of a large scale integrated circuit. FIG. 29 and FIG. 30 are schematic diagrams showing an embodiment.

FIG. 29 is a perspective view showing a Si chip of a 128 megabit dynamic random access memory (DRAM). On an integrated circuit substrate 190, there are provided electronic integrated circuit memory cell portions 191, 192 and 193 and electron emission element arrays 194, 195 and 196 for write and read of records into and out of respective memory cell portions and for connection 197 between memory cell portions. Above-mentioned electron emission element array consists of similar elements such as shown in FIG. 23. In a conventional integrated circuit, FETs and bipolar transistors are used and Al interconnection formed on the substrate for connection between elements. In such an interconnection system, time delay in signal transmission is increased by electric resistance and distributed capacitance of the interconnection itself when the degree of integration of elements reaches 100 megabits and more and interconnection width becomes 0.3 μm and less. In order to improve the high speed performance of the integrated circuit itself without lowering the operation speed thereof, it is recommended to adopt a space propagation system in place of an interconnection system.

In an integrated circuit shown in FIG. 29, a vacuum semiconductor microelectronic device included in each electron emitting element array is acting as an emission source of signal transmitting electrons. On the other hand, electrons coming flying from another vacuum semiconductor microelectronic device reach an anode of other vacuum semiconductor microelectronic device to produce a signal current.

FIG. 30 shows a schematic diagram in case above-mentioned system is used for connection among integrated circuit chips. The effect of the present system reveals itself more clearly because a signal transfer distance between chips is longer than the signal transfer distance in a chip in respective connections among integrated circuit substrates 200, 201, 202 and 203.

Besides, space propagation of electrons is employed for connection 197 among memory cell portions and connection 204 among integrated circuit substrates shown in FIG. 29 and FIG. 30, but it is a matter of course that an optical propagation system may be used.

Figure 36:
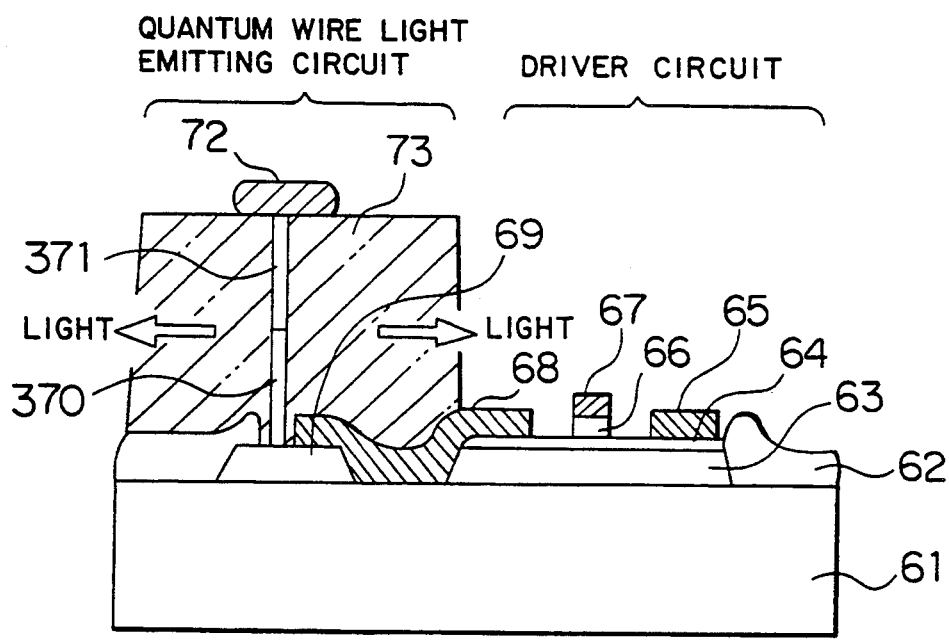
FIG. 36 is a sectional view of an integrated circuit microelectronic device composed of a quantum wire light emitting circuit and an FET in an embodiment 14.

When an optical propagation system in adopted, the electron emitting element arrays 194, 195 and 196 are replaced with quantum wire light emitting circuits shown in FIG. 36.

In either system, a circuit using a whisker is the base thereof and the whisker itself can grow at a temperature of approximately 400° C. Thus, a manufacturing process in which Al interconnection materials of a Si integrated circuit are not damaged may be constructed.

Embodiment 11

A vacuum measuring microcircuit was produced using whiskers as electron emission sources (emitters).

Figure 31A:
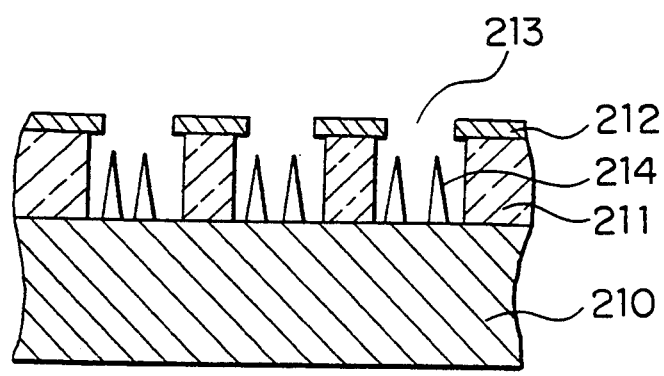
FIG. 31a and FIG. 31b are a sectional view and a perspective view of a vacuum measuring microelectronic device in an embodiment 11, respectively.
Figure 31B:
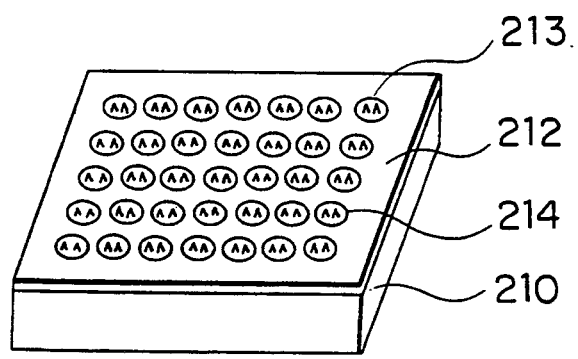

FIG. 31a and FIG. 31b show a part of sectional structure of the relevant circuit and a perspective view of the whole unit.

FIG. 31a; a sectional structure of the circuit is similar to that shown in FIG. 23, but a plurality of holes 213 each having a diameter of about 1 to 100 μm are formed in a laminated layer of an insulator 211 and a metal 212 for electron pullout electrode. GaAs whiskers 214 are grown at portions where the substrate surface is exposed inside the holes 213 by organometallic thermal decomposition with the metal 212 as a mask. Here, a plurality of whiskers may grow in one hole.

FIG. 31b; Tungsten (W) was used for the holes 213 where the whiskers 214 were formed on the substrate 210 and the electron pullout electrode metal 212. The circuit has dimensions 0.5 (L)×0.5 (W)×0.2 (H) mm, which has been miniaturized by a large margin as compared with a conventional ionization vacuum gage having dimensions approximately 5 to 10 cm.

It has been found that the relevant circuit may be used for measurement of ultra-high vacuum at $10^{-8}$ Pa and below as the result that an emitter current at 5 mA was obtained in a vacuum at $1 \times 10^{-8}$ Pa when a voltage at 50 volts was applied to the pullout electrode metal 212 in FIG. 31b.

Further, a conventional ionization vacuum system could not be used for vacuum measurement in a pressure range of about 0.1 to 1 Pa because a hot-cathode was used. However, it has been found that the microelectronic device of the present invention can be used sufficiently due to its cold-cathode emitter system.

Since the radius of curvature at the tip of the whisker can be made small when the whisker is used as an electron emission material as described in the above embodiments 6 to 11, the electron emission efficiency is improved. Accordingly, the door is kept open to the application to a small-sized vacuum semiconductor microelectronic device in which a stabilized cathode current is obtainable as a cold-cathode.

Embodiment 12

Figure 32:
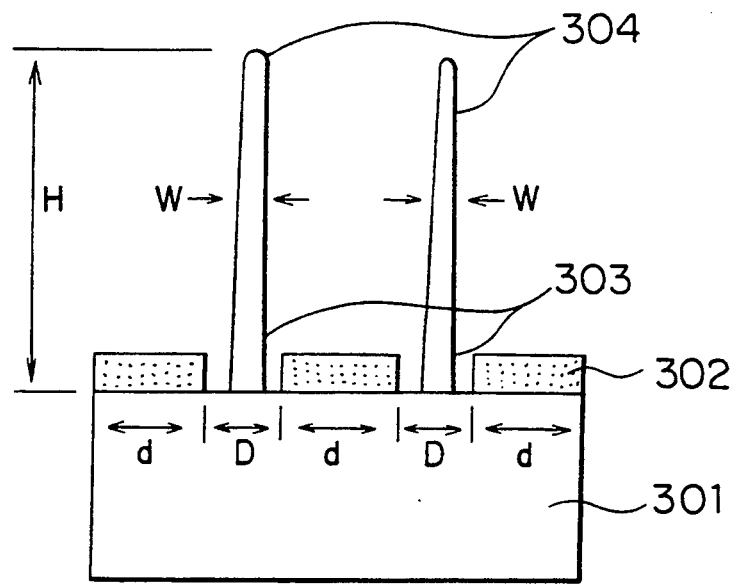
FIG. 32 is a sectional view of quantum wires in an embodiment 12.
Figure 33A:
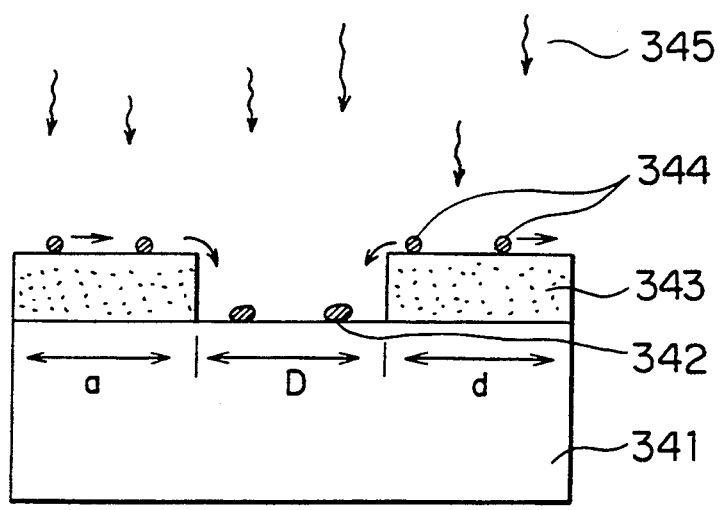
FIG. 33a and FIG. 33b are schematic section diagrams showing a quantum wire forming mechanism according to the present invention.
Figure 33B:
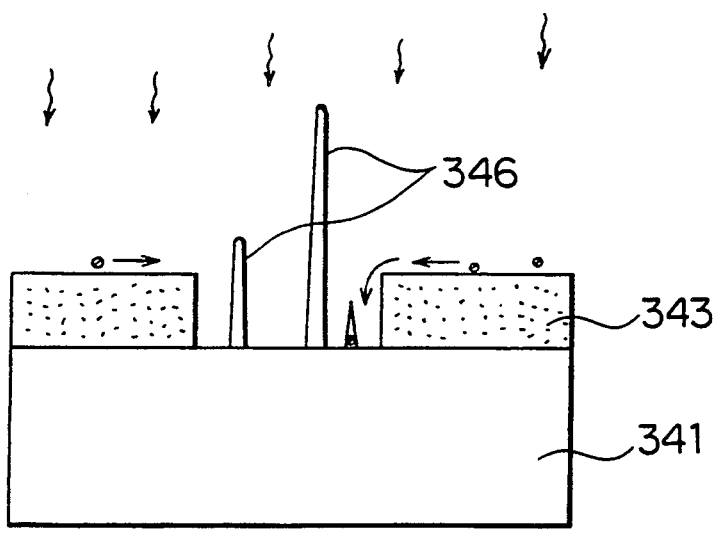

A quantum wire in an embodiment 12 of the present invention will be described with reference to FIG. 32.

An insulating film 302 composed of $SiO_2$ is accumulated in the thickness of 0.3 μm by CVD on a plane (111) of a semi-insulating GaAs substrate 301. Thereafter, circular windows 303 are formed on the SiO insulating film 302 by photolithography. A dimension d of the portion of the substrate 301 covered by the $SiO_2$ insulating film 302 is set to 500 μm, and the dimension D of the window 303 is set to 1 μm. Then, GaAs quantum wire-like whiskers are formed by organometallic thermal decomposition (MOCVD).

Here, trimethylgallium (TMG) was used for the III group material, and arsine ($AsH_3$) was used for the v group material. Monocrystalline fine whiskers, each having a diameter of 500 Å and a length of 8,000 Å, have grown perpendicularly to the substrate surface at the $SiO_2$ insulating film windows 303 when the substrate temperature was at 450° C. and the raw material gas feed time was at 300 seconds.

Figure 34:
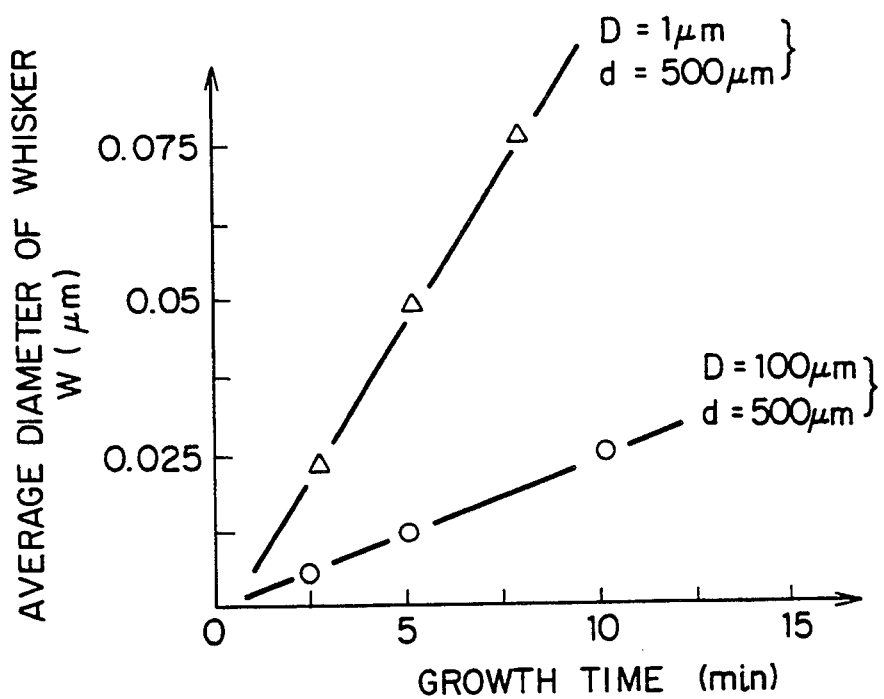
FIG. 34 is a diagram showing a relationship between the thickness and the growth time of a quantum wire.

FIG. 34 is a graph showing a relationship between the diameter W of the monocrystalline fine whiskers and the growth time. Here, the relationship is shown with the dimension D of the window 303 and the dimension d of the portion of the $SiO_2$ film 302 as parameters.

When the dimension D of the window 303 is at 1 μm and the dimension d of the portion of the $SiO_2$ film 302 is at 500 μm, a single crystalline fine whisker grows at the window 303.

On the other hand, when the dimension D of the window is enlarged to 100 μm, a plurality of crystal-line fine whiskers grow at the window 303, and the diameter of each fine whisker became smaller than the case when the dimension D of the window 303 is at 1 μm.

Furthermore, as a result of an experiment performed using a substrate provided with no insulating film 302, crystal growth in a fine wire form was not noticed at all, but only a flat monocyrstal film has grown uniformly on the substrate surface.

Embodiment 13

In the present embodiment, an AlGaAs epitaxial growth layer is provided at a part of a GaAs substrate surface, and selective growth similar to that in the embodiment 12 was performed.

Figure 35:
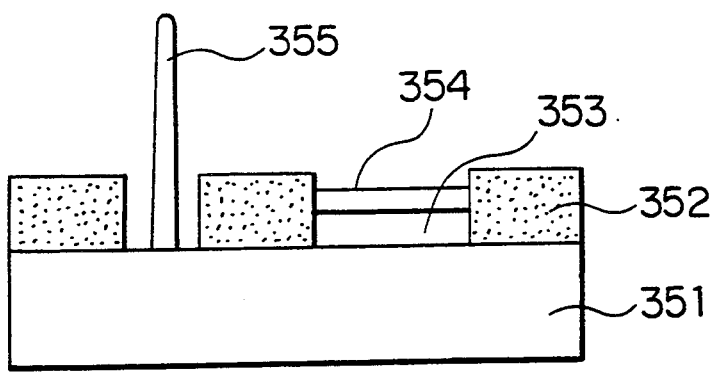
FIG. 35 is a sectional view showing an embodiment 13.

FIG. 35 shows a sectional structure of a substrate after selective growth. Here, a substrate 351 is composed of GaAs, and an AlGaAs layer 353 is grown epitaxially in the thickness of 0.1 μm on the substrate surface by MOCVD. Thereafter, a part of the AlGaAs epitaxial layer is removed by etching, thereby to form a SiO$_2$ pattern 352. The thickness of SiO$_2$ was set to 0.3 μm. Next, when a GaAs fine whisker was tried to be formed by selective growth by MOCVD, a fine whisker has grown at a SiO$_2$ window where the GaAs substrate is exposed. The diameter of fine whisker was about 500 Å in diameter and 2 μm in length.

On the other hand, at the window of SiO$_2$ where the AlGaAs epitaxial film is exposed, no fine whisker has grown, but epitaxial growth of GaAs has occurred in a uniform thcikness of 200 Å.

With the embodiment 13, it has been found that the crystal of GaAs quantum wire-like whisker grows on GaAs only and does not grow on AlGaAs and SiO$_2$.

Embodiment 14

A circuit element in which a quantum wire-like whisker light emitting element and an FET were integrated on the same substrate was produced on the basis of growth characteristics of a quantum whisker obtained from the embodiment 13.

FIG. 36 shows schematically a sectional structure of such an integrated circuit element.

In FIG. 36 in particular, a structure of a driver circuit portion consisting of a light emitting circuit and an FET is shown. In the quantum wire light emitting circuit, a fine whisker having a diameter 100 Å composed of a pn junction of n-type GaAs 370 and p-type GaAs 370 acts as a light emitting diode. Here, electron energy is split into discrete levels in a step form in a plane perpendicular to the fine wire in the pn junction diode fine wire by a quantization effect.

Accordingly, when a forward bias is applied to the pn junction so as to apply an electric current, an emission spectrum by recombination of electrons and holes in the vicinity of the pn junction plane shows much better monochromaticity as compared with a conventional light emitting diode. Further, a laser resonator structure may be formed by selecting the material and the configuration of a matrix 373 which buries the quantum wire. In this case, the emission spectrum shows light of high incoherence.

Embodiment 15

In the present embodiment, an InAs fine whisker was formed in a similar manner as above-described embodiment in place of the GaAs fine whisker. The diameter of the fine whisker is at 100 Å, and the motion of electrons in the fine whisker is restrained in a plane perpendicular to the fine wire by the quantization effect. A pn junction diode was produced using the InAs quantum wire.

Figure 37:
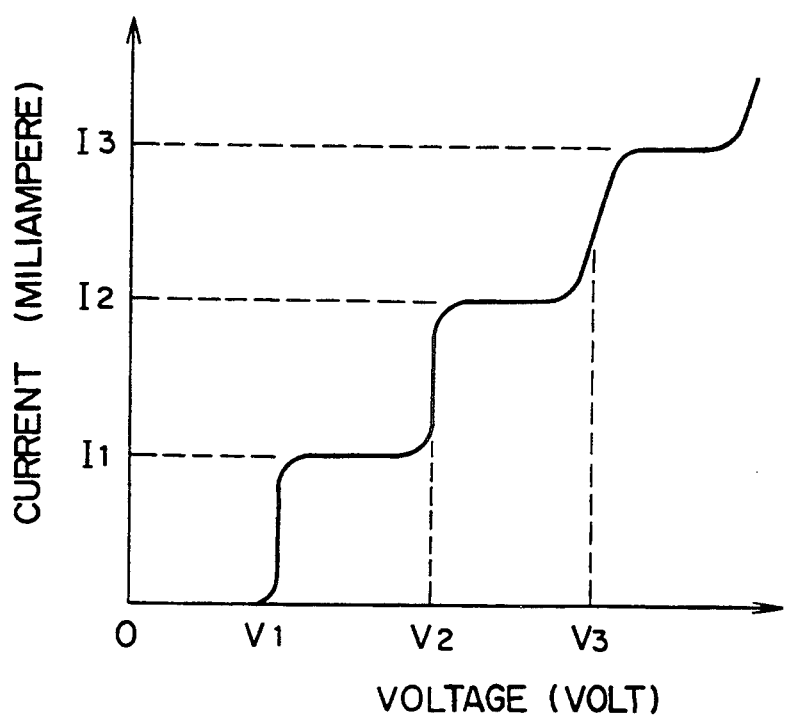
FIG. 37 is a current-voltage characteristic diagram of a pn junction diode in art embodiment 15.
Figure 40A:
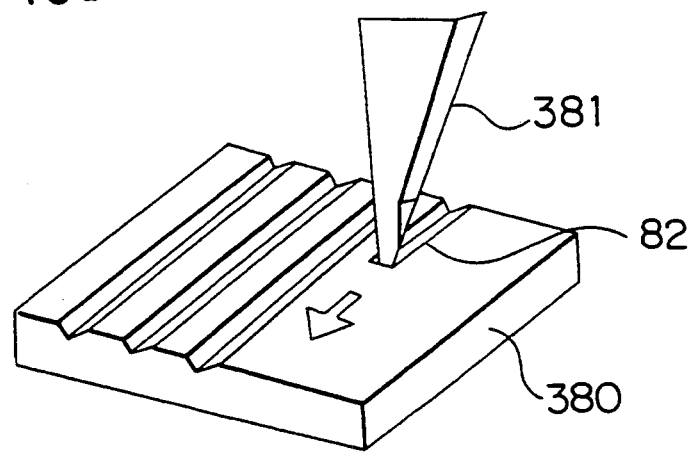
FIG. 40a, FIG. 40b and FIG. 40c are schematic diagrams showing a forming method of whiskers according to the present invention.
Figure 40B:
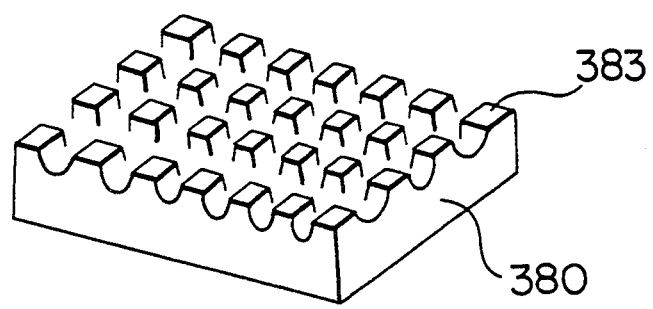
Figure 40C:
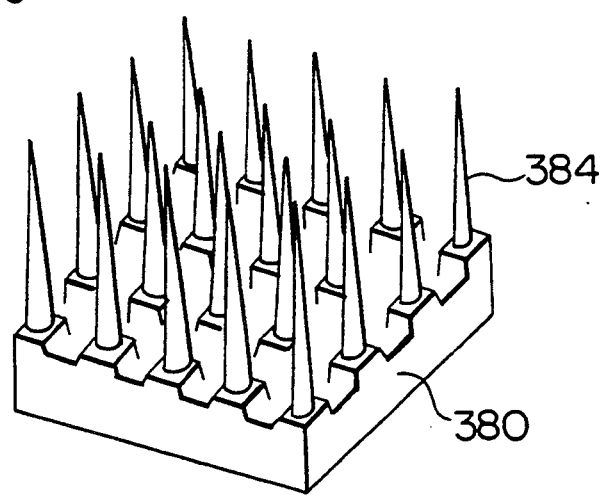
Figure 41A:
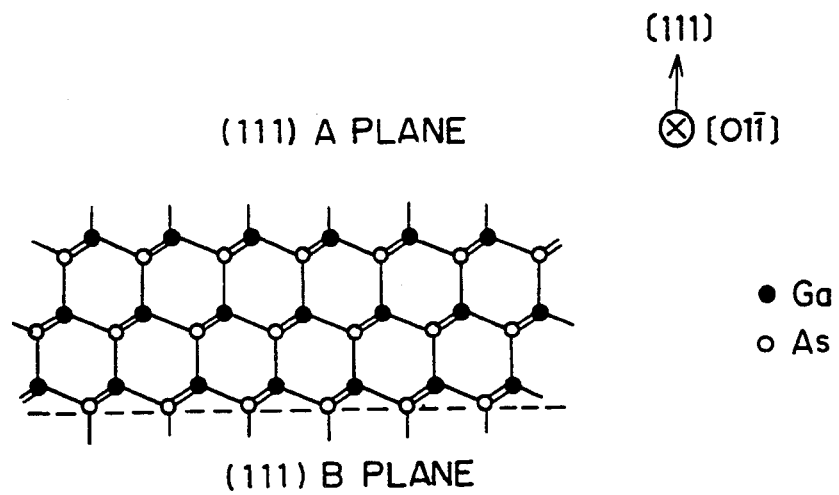
FIG. 41a, FIG. 41b, FIG. 41c and FIG. 41d are schematic diagrams of atomic coupling for explaining growth axis directions of a whisker or a quantum wire according to the present invention.
Figure 41B:
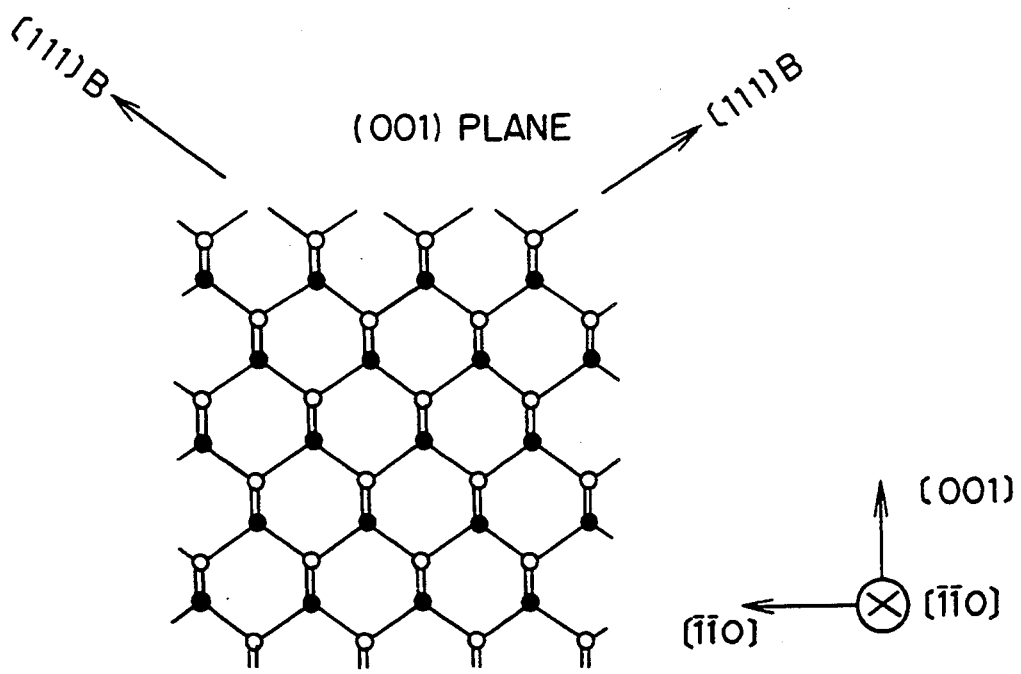
Figure 41C:
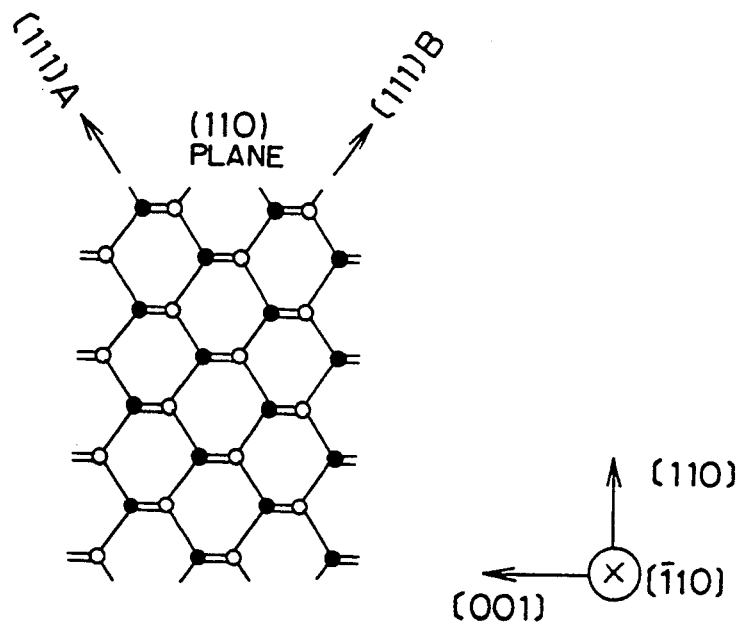
Figure 41D:
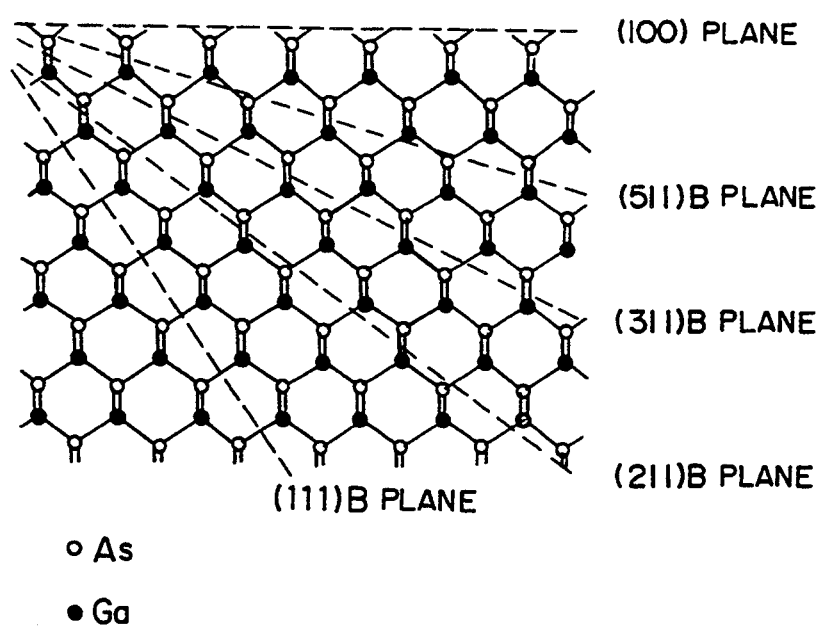
Figure 42:
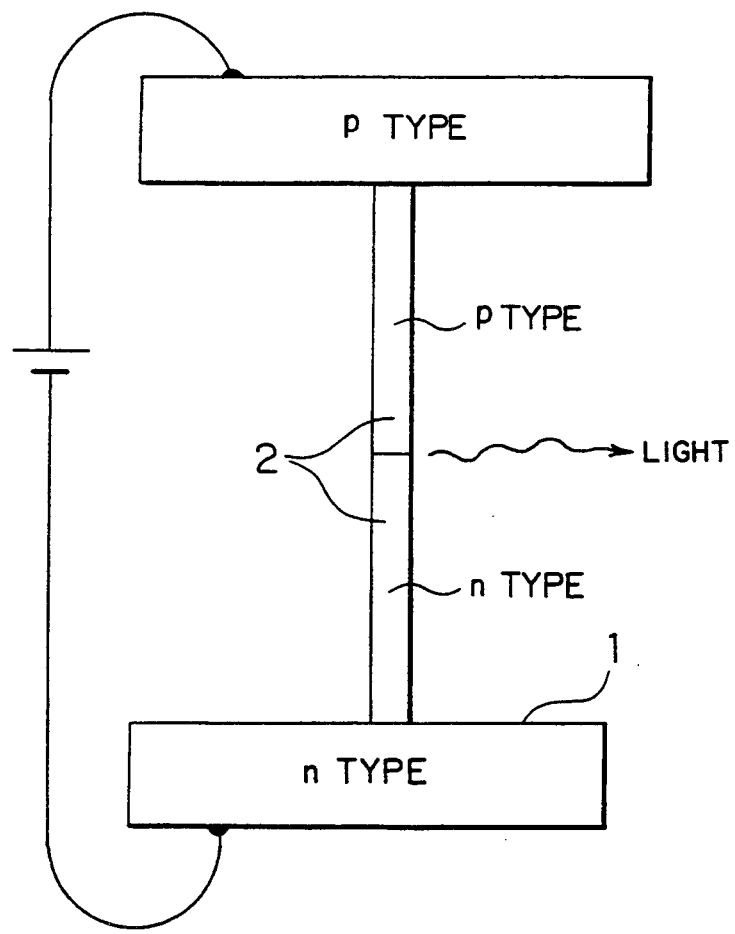
FIG. 42 is a schematic diagram showing a basic structure of an optical microelectronic device using a whisker crystal of the present invention.
Figure 43:
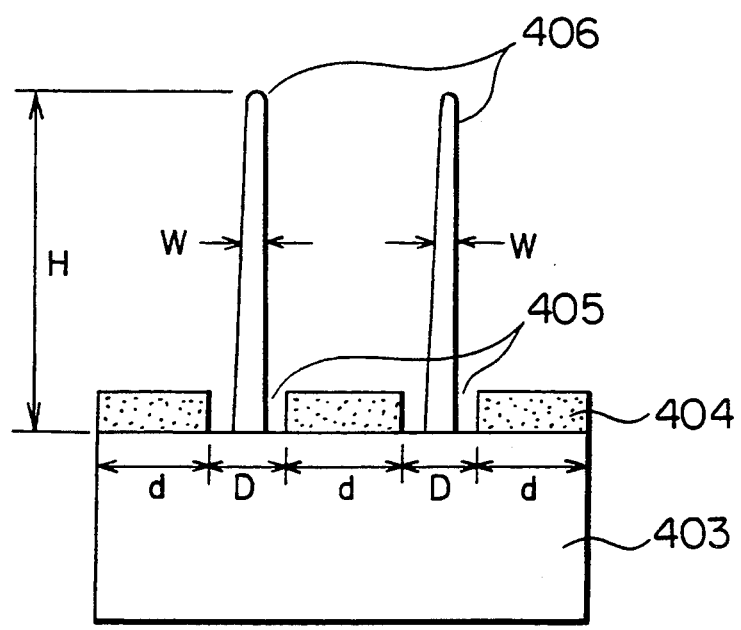
FIG. 43 is a schematic diagram showing a state of growth of whisker crystals.

FIG. 37 is a schematic graph showing current-voltage characteristic of such a pn junction diode. The current-voltage chracteristic shows abrupt-functionwise operation by the quantization effect. In FIG. 37, $V_1 \approx V_2 > 0.5$ volt, and the abrupt function characteristic became more conspicuous when the microelectronic device was cooled down to a temperature at room temperature and below.

Being different from a conventional pn junction diode, such a diode operates as a stable current source from which a constant current is obtainable against voltage drift, for example, at a voltage between voltages $V_1$ and $V_2$.

Incidentally, a case in which InAs is used for a material has been described in the present invention. However, the quantization effect reveals itself more clearly by using other semiconductor materials having small effective mass of electrons such as InSb, GaAs and Ce.

Furthermore, an accumulation method utilizing surface reaction of a raw material gas on the substrate surface may be used in a vacuum other than MOCVD described in the present embodiment as a forming method of a fine whisker.

Embodiment 16

Figure 44:
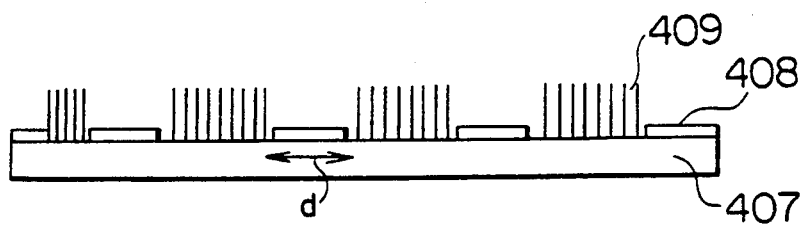
FIG. 44 is a schematic diagram showing a state of whiskers which have grown on a substrate in an embodiment 16.

A light emitting diode in an embodiment 16 of the present invention will be described with reference to FIG. 44 and FIG. 45.

An insulating film 408 composed of SiO$_2$ is accumulated in the thickness of 0.3 μm by CVD on an n-type GaAs substrate (carrier density: $10^{18}$ cm$^{-3}$, plane orientation (111) plane) 407. Thereafter, windows each having a size 15 μm × 15 μm are formed in a SiO$_2$ insulating film 408 by photolithography as shown in FIG. 44. The dimension d of the substrate portion 407 coated with the SiO$_2$ insulating film 408 was set to 500 μm. Next, GaAs whisker crystals are formed by organometallic thermal decomposition (MOCVD). Here, trimethylgallium (TMG) was used for the III group raw material and arsine (AsH$_3$) was used for the V group raw material. When the substrate temperature was at 450° C. and the raw material gas supply time was at 300 seconds, a plurality of whisker crystals 409 composed of GaAs have grown at SiO$_2$ insualting film windows as shown in FIG. 44.

The whisker had a uniform length of approximately 2 μm, and measured approximately 100 Å in diameter. When photoluminescense from the whiskers was measured by irradiating these crystals with light from Ar ion laser having a wavelength of 0.53 μm, it was found that the wavelength of luminescense had shifted toward high energy side by approximately 100 meV at the liquid nitrogen temperature as compared with a case of an ordinary GaAs crystal. Thus, it has been proved that exciton light emission based on transition between bands has shifted toward the high energy side in the whiskers by the quantum confinement effect.

Next, when similar whisker crystals were grown after varying the type of dopant on the way of growth under above-described crystal growth conditions, the electric property of the whiskers has changed on the way from an n-type to a p-type. The length and the diameter of the whisker were similar to the abovementioned results.

Figure 45:
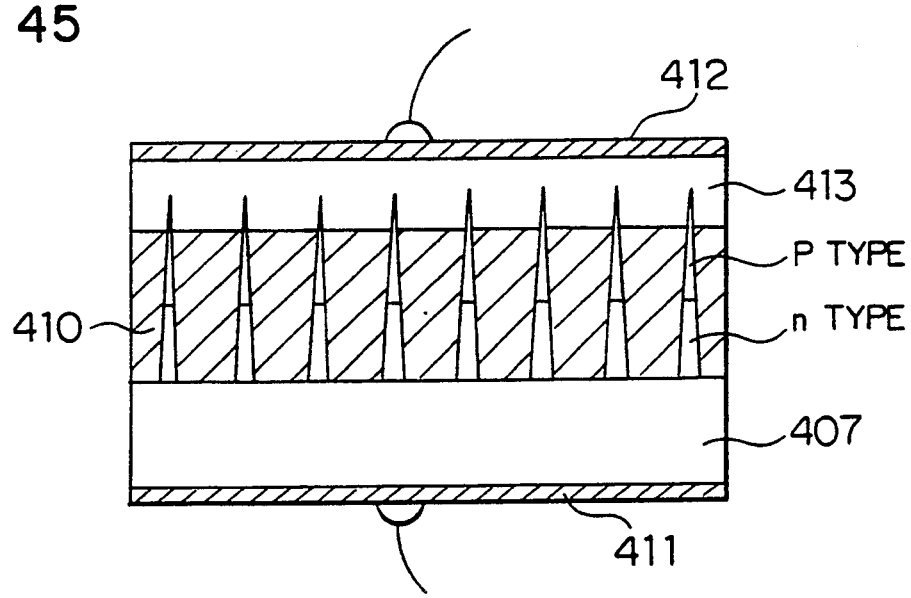
FIG. 45 is a sectional view of an optical microelectronic device in which whisker crystals shown in embodiments 16 and 17 are used.
Figure 46:
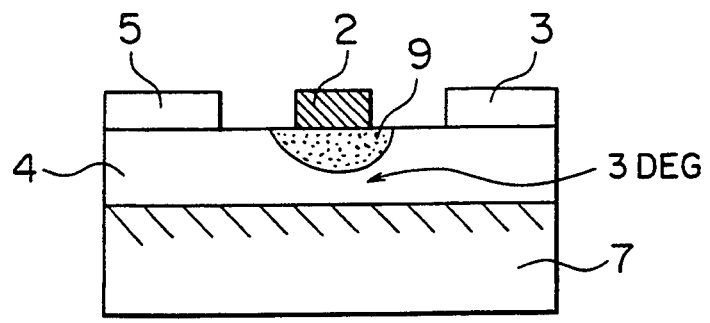
FIG. 46 is a sectional view of a conventional MOSFET.
Figure 47:
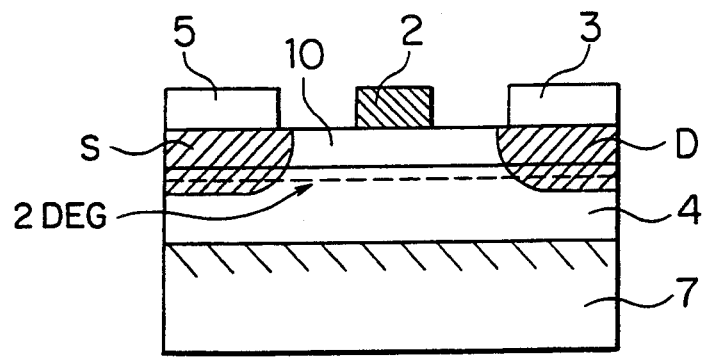
FIG. 47 is a sectional view of a conventional HEMT.
Figure 48:
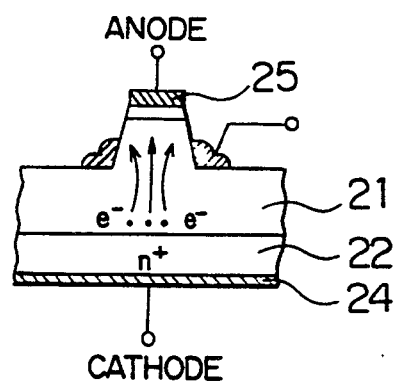
FIG. 48 is a sectional view of a conventional ballistic transistor.

After having such whisker crystals grow, an i-type Al$_{0.3}$Ga$_{0.7}$As layer 410 was grown by an ordinary method so as to bury whisker crystals as shown in Fig. 45. Furthermore, a p-type Al$_{0.3}$Ga$_{0.7}$As layer 413 was grown thereon also by an ordinary method.

When electrodes 411 and 412 were formed with ohmic junction on the top and the bottom of the substrate which has been grown lastly as shown in FIG. 45, and a voltage is applied so as to apply an electric current, light was emitted from the pn junction portion and the waveform thereof has shifted toward the high energy side by 100 meV (liquid nitrogen temperature) similarly to the case described previously. Thus, it means that the quantum confinement effect has occurred in the pn junction in this case, too. Further, full width of half maximum (FWHM) of light is 10 meV, which is very small as compared with an ordinary light emitting diode, and is smaller than that of what is called a luminescense diode. Thus, these whisker crystals are very effective as a light source for optical communication.

Embodiment 17

Both surfaces of the structure shown in Fig. 45 were made into parallel mirror planes by cleavage, forming a laser resonator. The length of the resonator was set to 300 μm. Full width of half maximum of the laser beam which has oscillated from the end plane of the laser showed 200 MHz, which is a value one place down as compared with an ordinary semiconductor laser of the same type. Thus, it is understood that a semiconductor laser utilizing whiskers is suitable as a light source for optical communication.

Embodiment 18

In the structure shown in the embodiment 17, the electric property was changed from an n-type directly to a p-type in the longitudinal direction of the whisker. However, when an i-layer having the thickness of 0.1 μm was inserted between the n-type and the p-type laser oscillation occurred in a similar manner as the embodiment 17, and the threshold current density of oscillation is decreased to 150 A/cm$^2$, which is about half as compared with a case of a conventional semiconductor laser. Also full width of half maximum of the oscillating light showed high performance of 20 MHz similarly to the case of the embodiment 17.

Embodiment 19

In the structure shown in FIG. 45, an insulating layer composed of polyimide isoindroquinazolinedione (PIQ: Trademark of Hitachi Chemical Co., Ltd.) was used as the buried layer 410, and electrode metallic layers forming ohmic junction directly thereon were formed. When an element consisting of such a structure was cut down to 250 μm long and an electric current was applied after inserting the element into a resonator system composed of mirrors each having the length of 500 μm, full width of half maximum of the emitting light was reduced further as compared with the case of the embodiment 17 and reached approximately 10 MHz.

Embodiment 20

In the embodiment 19, the whisker has simply changed from an n-type to a p-type in a longitudinal direction. However, when an i-layer was formed in the thickness of 0.1 μm at the pn junction, the threshold current density of oscillation is decreased to 150 A/cm$^2$, which is about half as compared with a case of a semiconductor laser. Full width of half maximum of the oscillating light also showed high performance of 10 MHz.

Embodiment 21

In all cases of above-described embodiments 16 to 20, GaAs was used as the substrate and GaAs was also used as the whisker, but satisfactory results almost similar to the characteristics described in the embodiments 16 to 20 were also obtained when InP was used as the substrate. The obtained results will be shown collectively hereunder.

(1) The whiskers were changed half-way from an n-type to a p-type using n-type InP ($10^{19}$ cm$^{-3}$) as the substrate 407. In GaAsP (gap wavelength: 1.55 μm) was adopted for whisker composition. i-type InP was adopted for the buried layer 410, and p-type InP was used for the layer 413 thereon. When carriers are implanted by applying an electric current after forming electrodes 411 and 412, satisfactory results of 10 meV were obtained for the semiconductor width of emission light.

(2) Both ends of the structure described in the above item (1) were made into parallel mirror planes by cleavage thereby to form a laser resonator. The length of the resonator was set to 300 μm. A satisfactory value of 20 MHz was obtainable for full width of half maximum of light from this laser.

(3) When a laser in which the InGaAs whisker crystal having a structure described in the above item (2) was changed from an n-type to an i-type (thickness of 0.1 μm) and then to a p-type was produced, a satisfactory value of 100 A/cm$^2$ was obtained for the threshold current density of oscillation.

(4) When a laser was produced using an insulator composed of PIQ as the buried layer 410, a further satisfactory value of approximately 10 MHz was obtained for full width of half maximum of a laser beam.

Embodiment 22

A plane (111) was always used as the crystal substrate in above-described embodiments 16 to 21, but exactly the same satisfactory results as the case of a plane (111) were also obtained naturally in the case of the plane (111) with an optical element having an equivalent structure as those of the embodiments 16 to 21. Further, when a plane (100) was used as the substrate, exactly the same satisfactory results as the optical elements shown in the embodiments 1 to 5 were obtained except that whisker crystal were not grown perpendicularly to the substrate but grown in a direction inclined by approximately 30° from the perpendicular direction. Furthermore, above-mentioned results were obtained when the plane orientation was along a crystal axis, but exactly the same satisfactory results as the results described in the embodiments 16 to 21 were obtained even when the plane orientation is shifted from the axis within 5°.

According to the embodiments 16 to 22, carriers are implanted by applying an electric current to a whisker crystal having a small diameter and very little crystal defects. Accordingly, very important effects in point of characteristics such as reduction in full width of half maximum and reduction in threshold current density in produced light emitting diodes and laser diodes are obtained by the quantum confinement effect.

As described in above-mentioned embodiments, according to the present invention, production of variety of elements such as a light emitting device becomes easier because quantum wire crystal can be formed in circumferential air or medium having a refractive index equivalent to or more than air. Thus, the way of application to variety of elements utilizing the quantum effect is cleared.

As the material for the whiskers, it is possible to use III-V group compound semiconductors such as GaAs, AlGaAs, InP, InGaAs, InAlAs, InGaP, GaSb and InSb, II-VI group compound semiconductors such as HgTe, ZnSe, ZnS, ZnTe, CdTe and PbHgTe, and element semiconductors such as Ge and Si.

We claim:

1. A semiconductor device, comprising:

a semiconductor substrate of one conductive type; and a semiconductor whisker channel which is grown epitaxially on said substrate and has a diameter of 0.1 μm or less to contact with a surface of the substrate at one end thereof and apart from the substrate surface at another end thereof, and acts as a semiconductor quantum wire;

wherein said whisker channel has two ends and both ends are connected electrically to ohmic electrodes.

2. A semiconductor device according to claim 1, wherein said whisker channel forms a channel of a field effect transistor.

3. A semiconductor device according to claim 2, wherein said whisker channel is buried with an insulator layer, a gate film and an insulator layer in this order so as to surround the circumference of said whisker channel, and the conductive type of said substrate and whisker channel is an n-type.

4. A semiconductor device according to claim 3, wherein said substrate is composed of a semi-insulating substrate with an n-type GaAs layer formed thereon, and said whisker channel is composed of n-type InAs.

5. A semiconductor device according to claim 2, wherein said whisker channel is buried with an n-type compound semiconductor layer, a gate film and an n-type compound semiconductor layer in this order, said n-type compound semiconductor has an electron affinity smaller than that of the compound semiconductor of said whisker channel, the conductive type of said substrate is an n-type, and said whisker channel is undoped.

6. A semiconductor device according to claim 3, wherein a Schottky junction is formed where said gate film and said whisker channels are joined with each other.

7. A semiconductor device according to claim 4, wherein a Schottky junction is formed where said gate film and said whisker channels are joined with each other.

8. A semiconductor device according to claim 5, wherein a Schottky junction is formed where said gate film and said whisker channels are joined with each other.

9. A semiconductor device according to claim 2, wherein said whisker channel grows perpendicularly to said substrate surface.

10. A semiconductor device according to claim 3, wherein said whisker channel grows perpendicularly to said substrate surface.

11. A semiconductor device according to claim 4, wherein said whisker channel grows perpendicularly to said substrate surface.

12. A semiconductor device according to claim 5, wherein said whisker channel grows perpendicularly to said substrate surface.

13. A semiconductor device according to claim 6, wherein said whisker channel grows perpendicularly to said substrate surface.

14. A semiconductor device according to claim 7, wherein said whisker channel grows perpendicularly to said substrate surface.

15. A semiconductor device according to claim 8, wherein said whisker channel grows perpendicularly to said substrate surface.

16. A semiconductor device according to claim 1, wherein said whisker channel forms a ballistic transistor channel, the length thereof is 400 nm or shorter, a Schottky gate film is formed on said semiconductor substrate of one conductive type so as to surround said ballistic transistor channel, the film thickness of said gate film corresponds to the length of said ballistic transistor channel, and said semiconductor substrate of one conductive type is composed of an n-type compound semiconductor.

17. A semiconductor device according to claim 1, wherein an undoped compound semiconductor layer is formed between said whisker channel and said semiconductor substrate of one conductive type, a ballistic transistor channel is formed with said undoped compound semiconductor layer and said whisker channel, the length of the channel has the length of 400 nm or less, a Schottky gate film is formed on said undoped compound semiconductor layer so as to surround said ballistic transistor channel, the film thickness of said gate film corresponds to the length of said ballistic transistor channel, and the conductive type of said semiconductor substrate of one conductive type is an n-type.

18. A semiconductor device according to claim 16, wherein said whisker channel is buried with an insulator layer at the top and the bottom of said gate film, and the whisker channel projecting from the top insulator layer is buried with a highly doped n-type semiconductor layer.

19. A semiconductor device according to claim 17, wherein said whisker channel is buried with an insulator layer at the top and the bottom of said gate film, and the whisker channel projecting from the top insulator layer is buried with a highly doped n-type semiconductor layer.

20. A semiconductor device according to claim 16, wherein said whisker channel grows perpendicularly to said substrate surface.

21. A semiconductor device according to claim 17, wherein said whisker channel grows perpendicularly to said substrate surface.

22. A semiconductor device according to claim 18, wherein said whisker channel grows perpendicularly to said substrate surface.

23. A semiconductor device according to claim 19, wherein said whisker channel grows perpendicularly to said substrate surface.

24. A semiconductor device according to claim 1 wherein said semiconductor quantum wire is formed by surrounding around a circumference of said semiconductor whiskers with air or a medium having a refractive index equivalent to that of air, and a diameter of each semiconductor whisker is at 0.1 μm or less.

25. A semiconductor device according to claim 1 wherein said semiconductor quantum wire has a junction between different conductive types in the direction of said both ends of said semiconductor quantum wire.

26. A semiconductor device according to claim 24, wherein said semiconductor quantum wire has a junction between different conductive types in the direction of said both ends of said semiconductive quantum wire.

27. A semiconductor device according to claim 1, wherein said semiconductor quantum wire has a heterojunction of semiconductor included in III-V group compound semiconductors, II-VI group compound semiconductors and element semiconductors in the direction of said both ends of said semiconductor quantum wire.

28. A semiconductor device according to claim 24, wherein said semiconductor quantum wire has a heterojunction of semiconductors including in III-V group compound semiconductors, II-VI group compound semiconductors and element semiconductors in the direction of said both ends of said semiconductor quantum.

29. A semiconductor device according to claim 27, wherein said semiconductor device further comprises a transistor formed on said substrate.

30. A semiconductor device according to claim 28, wherein said semiconductor device further comprises a transistor formed on said substrate.

31. A semiconductor device according to claim 1, wherein said semiconductor whisker channel is formed through a mask composed of at least two layers, having at least one opening portion provided on a surface of said substrate exposed in the opening region of the mask.

32. A semiconductor device according to claim 31, wherein a line of semiconductor whiskers is formed in an opening portion of a mask.

33. A semiconductor device according to claim 31, wherein, in a mask opening portion in which said semiconductor whisker is formed, a first mask layer closest to the substrate is composed of an insulator and at least one layer among mask layers except said first mask layer is composed of a metal.

34. A semiconductor device according to claim 1, wherein said semiconductor device comprises an optical element in which light is emitted by applying an electric current to said semiconductor whisker channel through said electrodes.

35. A semiconductor device according to claim 34, wherein at least one electric element is formed further on said semiconductor substrate.

36. A semiconductor device, wherein a diameter of a whisker crystal is at 0.1 μm or less in the optical element set forth in claim 32.

37. A semiconductor device according to claim 34, wherein an electric property varies along a longitudinal direction of the whisker crystal in an optical element.

38. A semiconductor device according to claim 36, wherein an electric property is varied from one of a group consisting of an n-type to a p-type and a p-type to an n-type in an optical element.

39. A semiconductor device according to claim 36, wherein an electric property is varied from an n-type to an i-type and then to a p-type or from a p-type to an i-type and then to an n-type in an optical element.

40. A semiconductor device according to claim 34, wherein a medium around a whisker crystal is different from a material quality of the whisker crystal and electronegativity is smaller than that of the material quality of the whisker in an optical element.

41. A semiconductor device according to claim 34, wherein a medium around a whisker crystal is composed of an insulator in an optical element.

42. A semiconductor device according to claim 34, wherein a semiconductor substrate on which said whisker crystal is made to grow is composed of one of a group consisting of GaAs and InP.

43. A semiconductor device according to claim 42, wherein a plane orientation of a semiconductor substrate on which a whisker is made to grow is one of a group consisting of (110) and (111) in an optical element.

44. A semiconductor device according to claim 43, wherein shift of the plane orientation of a substrate is at 5° or less in the plane orientation of the semiconductor substrate.

45. A semiconductor device according to claim 1, wherein grooves are formed on a surface of said substrate, and said semiconductor whisker channel is formed on said substrate surface except on said grooves.

46. A semiconductor device according to claim 1, wherein a growth direction of the semiconductor whisker channel is in accord with a direction of an atomic dangling bond extending from elements forming an outer surface of the substrate.

47. A semiconductor device according to claim 1, wherein said semiconductor quantum wire is formed by surrounding a circumference of said semiconductor whisker with a medium being different from a material quality of said semiconductor whisker and having electronegativity smaller than that of the material quality of said semiconductor whisker.

48. A semiconductor device according to claim 1, wherein said semiconductor quantum wire is formed by surrounding a circumference of said semiconductor whisker with a medium being composed of an insulator.

* * * * *

UNITED STATES PATENT AND TRADEMARK OFFICE
CERTIFICATE OF CORRECTION

PATENT NO. : 5,362,972  
DATED : November 8, 1994  
INVENTOR(S) : Masamitsu Yazawa et al It is certified that error appears in the above-indentified patent and that said Letters Patent is hereby corrected as shown below:

| Column | Line | |
|---|---|---|
| 1 | 67 | Change "with" (1st occurrence) to --to--. |
| 1 | 68 | Change "remained constant" to --remaining constant,--. |
| 2 | 20 | change "V.s" to --V s--. |
| 2 | 26 | Change "V.s" (both occurrences) to --V s--. |
| 3 | 17 | Change "in section a" to --a section of a--. |
| 4 | 15 | Change "Hign-speed" to --high-speed--. |
| 4 | 17 | change "demanded. Thereupon," to --demand. Therefore,--. |
| 5 | 13 | After "solving" delete ",". |
| 5 | 24 | Change "on" to --in--. |
| 11 | 11 | Change "be revealed" to --achieve--. |
| 12 | 39 | Change "an operation" to --the function--. |
| 12 | 40 | Before "the material" insert --whether--. |
| 12 | 41 | Change "whether" to --is--. |
| 13 | 12 | After "FIG. 4" insert --shows--. |
| 13 | 15 | Change "direct Dn" to --direction--. |
| 14 | 22 | Change "art" to --an--. |
| 14 | 61 | Change "≃" to --≅--. |
| 15 | 24 | Change "as approaching" to --as it approaches--. |

UNITED STATES PATENT AND TRADEMARK OFFICE
CERTIFICATE OF CORRECTION

PATENT NO. : 5,362,972
DATED : November 8, 1994
INVENTOR(S) : Masamitsu Yazawa et al It is certified that error appears in the above-indentified patent and that said Letters Patent is hereby corrected as shown below:

| | | |
|---|---|---|
| 5 | 29 | Change "revealed" to --achieved--. |
| 5 | 34 | Change "decay" to --deterioration--. |
| 6 | 2 | Change "smeiconductor" to --semiconductor-- |
| 6 | 14 | Change "that" to --this--. |
| 7 | 41 | Change "2a" to --22a--. |
| 8 | 9 | Change "were" to --are--. |
| 8 | 24 | Change "Fig." to --FIGS.--. |
| 8 | 63 | Change "$\mu m$" to --$\mu m^2$--. |
| 9 | 55 | Change "4c" to --41c--. |
| 10 | 40 | Delete "participated". |

UNITED STATES PATENT AND TRADEMARK OFFICE
CERTIFICATE OF CORRECTION

PATENT NO. : 5,362,972
DATED : November 8, 1994
INVENTOR(S) : Masamitsu Yazawa et al It is certified that error appears in the above-indentified patent and that said Letters Patent is hereby corrected as shown below:

| | | |
|---|---|---|
| 15 | 31 | After "whiskers" insert --1--. |
| 18 | 6 | After "area" insert --to a greater degree-- |
| 18 | 41 | Change "Ce" to --Ge--. |
| 18 | 57 | Change "no" to --so--; after "forth." start new paragraph. |
| 18 | 58 | Change "anintegrated" to --an integrated--. |
| 19 | 38 | Delete "an". |
| 21 | 18 | Change "microsiemense" to --microsiemens--. |
| 22 | 25 | Change "as the whole emitters" to --by the entire group of emitters--. |
| 24 | 56 | Change "crystal-line" to --crystal-like--. |

UNITED STATES PATENT AND TRADEMARK OFFICE
CERTIFICATE OF CORRECTION

PATENT NO. : 5,362,972
DATED : November 8, 1994
INVENTOR(S) : Masamitsu Yazawa et al It is certified that error appears in the above-indentified patent and that said Letters Patent is hereby corrected as shown below:

| 26 | 49 | Change "on the way of" to --during--. |
| 27 | 43 | Change "500" to --300--. |
| 28 | 36 | Change "whisker crystal" to --whisker crystals--. |
| 30 | 25 | Change "top" to --upper--. |
| 30 | 31 | Change "top" to --upper--. |
| 30 | 62 | Change "semiconductor" to --semiconductors--. |
| 31 | 1 | Change "including" to --included--. |

Signed and Sealed this

First Day of August, 1995

Attest:

BRUCE LEHMAN

Attesting Officer     Commissioner of Patents and Trademarks

UNITED STATES PATENT AND TRADEMARK OFFICE
CERTIFICATE OF CORRECTION

PATENT NO. : 5,362,972

DATED : November 8, 1994

INVENTOR(S) : Masamitsu Yazawa et al

It is certified that error appears in the above-identified patent and that said Letters Patent is hereby corrected as shown below:

| Column | Line | |
|---|---|---|
| 1 | 67 | Change "with" (1st occurrence) to --to--. |
| 1 | 68 | Change "remained constant" to --remaining constant,--. |
| 2 | 20 | change "V.s" to --V s--. |
| 2 | 26 | Change "V.s" (both occurrences) to --V s--. |
| 3 | 17 | Change "in section a" to --a section of a--. |
| 4 | 15 | Change "Hign-speed" to --high-speed--. |
| 4 | 17 | change "demanded. Thereupon," to --demand. Therefore,--. |
| 5 | 13 | After "solving" delete ",". |
| 5 | 24 | Change "on" to --in--. |

UNITED STATES PATENT AND TRADEMARK OFFICE
CERTIFICATE OF CORRECTION

PATENT NO. : 5,362,972

DATED : November 8, 1994

INVENTOR(S) : Masamitsu Yazawa et al

It is certified that error appears in the above-indentified patent and that said Letters Patent is hereby corrected as shown below:

| | | |
|---|---|---|
| 5 | 29 | Change "revealed" to --achieved--. |
| 5 | 34 | Change "decay" to --deterioration--. |
| 6 | 2 | Change "smeiconductor" to --semiconductor-- |
| 6 | 14 | Change "that" to --this--. |
| 7 | 41 | Change "2a" to --22a--. |
| 8 | 9 | Change "were" to --are--. |
| 8 | 24 | Change "Fig." to --FIGS.--. |
| 8 | 63 | Change "$\mu m$" to --$\mu m^2$--. |
| 9 | 55 | Change "4c" to --41c--. |
| 10 | 40 | Delete "participated". |
| 11 | 11 | Change "be revealed" to --achieve--. |
| 12 | 39 | Change "an operation" to --the function--. |
| 12 | 40 | Before "the material" insert --whether--. |
| 12 | 41 | Change "whether" to --is--. |
| 13 | 12 | After "FIG. 4" insert --shows--. |
| 13 | 15 | Change "direct Dn" to --direction--. |
| 14 | 22 | Change "art" to --an--. |
| 14 | 61 | Change "$\simeq$" to --$\cong$--. |
| 15 | 24 | Change "as approaching" to --as it approaches--. |

UNITED STATES PATENT AND TRADEMARK OFFICE
CERTIFICATE OF CORRECTION

PATENT NO. : 5,362,972
DATED : November 8, 1994
INVENTOR(S) : Masamitsu Yazawa et al Page 3 of 4

It is certified that error appears in the above-indentified patent and that said Letters Patent is hereby corrected as shown below:

| | | |
|---|---|---|
| 15 | 31 | After "whiskers" insert --1--. |
| 18 | 6 | After "area" insert --to a greater degree-- |
| 18 | 41 | Change "Ce" to --Ge--. |
| 18 | 57 | Change "no" to --so--; after "forth." start new paragraph. |
| 18 | 58 | Change "anintegrated" to --an integrated--. |
| 19 | 38 | Delete "an". |
| 21 | 18 | Change "microsiemense" to --microsiemens--. |
| 22 | 25 | Change "as the whole emitters" to --by the entire group of emitters--. |
| 24 | 56 | Change "crystal-line" to --crystal-like--. |
| 26 | 49 | Change "on the way of" to --during--. |
| 27 | 43 | Change "500" to --300--. |
| 28 | 36 | Change "whisker crystal" to --whisker crystals--. |

UNITED STATES PATENT AND TRADEMARK OFFICE
CERTIFICATE OF CORRECTION

PATENT NO. : 5,362,972

DATED : November 8, 1994

INVENTOR(S) : Masamitsu Yazawa et al

It is certified that error appears in the above-identified patent and that said Letters Patent is hereby corrected as shown below:

| 30 | 62 | Change "semiconductor" to --semiconductors--. |
| 31 | 1 | Change "including" to --included--. |

This certificate supersedes the Certificate of Correction issued August 1, 1995.

Signed and Sealed this

Twenty-fourth Day of October, 1995

Attest:

BRUCE LEHMAN

Attesting Officer

Commissioner of Patents and Trademarks